(12) United States Patent
Kikumoto et al.

(10) Patent No.: US 9,947,572 B2
(45) Date of Patent: Apr. 17, 2018

(54) SUBSTRATE PROCESSING APPARATUS

(71) Applicant: SCREEN Holdings Co., Ltd., Kyoto (JP)

(72) Inventors: Noriyuki Kikumoto, Kyoto (JP); Kazuhiro Honsho, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 28 days.

(21) Appl. No.: 14/665,468

(22) Filed: Mar. 23, 2015

(65) Prior Publication Data
US 2015/0279721 A1 Oct. 1, 2015

(30) Foreign Application Priority Data

| Mar. 26, 2014 | (JP) | 2014-064488 |
| Mar. 26, 2014 | (JP) | 2014-064489 |
| Mar. 26, 2014 | (JP) | 2014-064490 |
| Mar. 26, 2014 | (JP) | 2014-064491 |

(51) Int. Cl.
*H01L 21/687* (2006.01)
*B23B 31/14* (2006.01)
*B23B 31/18* (2006.01)

(52) U.S. Cl.
CPC ........ *H01L 21/68785* (2013.01); *B23B 31/14* (2013.01); *B23B 31/18* (2013.01); *H01L 21/68728* (2013.01); *Y10T 279/18* (2015.01); *Y10T 279/23* (2015.01); *Y10T 279/27* (2015.01)

(58) Field of Classification Search
CPC ... B23B 31/14; B23B 31/18; H01L 21/68785; H01L 21/68728; Y10T 279/18; Y10T 279/247
See application file for complete search history.

(56) References Cited

U.S. PATENT DOCUMENTS

| 3,993,018 | A | * | 11/1976 | Kranik | .................... B05C 11/08 |
| | | | | | 118/503 |
| 4,677,758 | A | * | 7/1987 | Aigo | ................. H01L 21/67034 |
| | | | | | 279/131 |
| 5,350,427 | A | * | 9/1994 | Freytsis | ............ H01L 21/68721 |
| | | | | | 118/503 |

(Continued)

FOREIGN PATENT DOCUMENTS

| JP | 07-169732 A | 7/1995 |
| JP | 10-335287 A | 12/1998 |

(Continued)

*Primary Examiner* — Eric A Gates
(74) *Attorney, Agent, or Firm* — Ostrolenk Faber LLP

(57) ABSTRACT

In a substrate processing apparatus, a shield plate includes a first chucking magnetic material (441). The shield plate is moved up and down by a chamber opening-and-closing mechanism. A substrate holding part includes a movable chuck member (412) and a fixed chuck member. The movable chuck member (412) includes a second chucking magnetic material (442). When the shield plate is moved down, the shield plate comes in close proximity to the upper surface of a substrate (9), and the first chucking magnetic material (441) comes in close proximity to the second chucking magnetic material (442). The substrate (9) is held by magnetic action between the first chucking magnetic material (441) and the second chucking magnetic material (442). It is thus possible to hold the substrate (9) with a simple structure.

21 Claims, 22 Drawing Sheets

(56) References Cited

U.S. PATENT DOCUMENTS

| | | | | |
|---|---|---|---|---|
| 5,376,216 | A * | 12/1994 | Yoshioka | H01L 21/68728 156/345.55 |
| 5,658,231 | A * | 8/1997 | Schmitt | B04B 7/00 279/131 |
| 5,989,342 | A * | 11/1999 | Ikeda | B05C 11/08 118/319 |
| 6,446,643 | B2 | 9/2002 | Curtis et al. | 134/25.4 |
| 6,485,531 | B1 | 11/2002 | Schöb | 29/25.01 |
| 6,935,638 | B2 * | 8/2005 | Ivanov | B23B 31/14 118/416 |
| 7,284,760 | B2 * | 10/2007 | Siebert | H01L 21/68707 118/500 |
| 7,866,058 | B2 * | 1/2011 | Kim | B23B 31/28 118/313 |
| 8,038,838 | B2 * | 10/2011 | Kim | H01L 21/68728 118/730 |
| 8,172,646 | B2 * | 5/2012 | Feng | H01L 21/68728 279/106 |
| 8,435,380 | B2 * | 5/2013 | Kim | H01L 21/68728 134/157 |
| 8,714,169 | B2 * | 5/2014 | Lee | H01L 21/67051 134/149 |
| 9,038,262 | B2 * | 5/2015 | Wu | H01L 21/68728 29/559 |
| 9,385,020 | B2 * | 7/2016 | Kato | H01L 21/68792 |
| 9,421,617 | B2 * | 8/2016 | Goodman | B23B 31/14 |
| 2004/0159343 | A1 | 8/2004 | Shimbara et al. | 134/33 |
| 2004/0195785 | A1 * | 10/2004 | Jan | H01L 21/68728 279/106 |
| 2008/0127888 | A1 | 6/2008 | Kim et al. | 118/52 |
| 2009/0079122 | A1 | 3/2009 | Obweger | 269/57 |
| 2010/0126539 | A1 | 5/2010 | Lee et al. | 134/157 |
| 2010/0222919 | A1 | 9/2010 | Kazuyuki et al. | 700/228 |
| 2012/0224945 | A1 | 9/2012 | Douki et al. | 414/758 |
| 2013/0213437 | A1 * | 8/2013 | Ishii | B08B 1/001 134/6 |
| 2013/0214497 | A1 * | 8/2013 | Yoshida | H01L 21/68728 279/131 |
| 2013/0334172 | A1 | 12/2013 | Matsumoto et al. | 216/85 |
| 2014/0060423 | A1 | 3/2014 | Nakai et al. | 118/50 |
| 2014/0362273 | A1 | 12/2014 | Okura et al. | 348/308 |

FOREIGN PATENT DOCUMENTS

| | | |
|---|---|---|
| JP | 2004-111902 A | 4/2004 |
| JP | 2005-019456 | 1/2005 |
| JP | 2005-142585 A | 6/2005 |
| JP | 2009-528916 A | 8/2009 |
| JP | 2010-130021 A | 6/2010 |
| JP | 2013-110270 A | 6/2013 |
| JP | 2013-232512 A | 11/2013 |
| JP | 2014-022419 A | 2/2014 |
| JP | 2014-49606 A | 3/2014 |
| JP | 2014-241492 A | 12/2014 |

* cited by examiner

SUBSTRATE PROCESSING APPARATUS

TECHNICAL FIELD

The present invention relates to a substrate processing apparatus for processing a substrate.

BACKGROUND ART

A conventional process of manufacturing a semiconductor substrate (hereinafter, simply referred to as a "substrate") involves various types of processing performed on the substrate by a substrate processing apparatus. For example, processing such as supplying a chemical solution to a substrate having a resist pattern on its surface and thereby etching the surface of the substrate is performed. After completion of the etching process, processing for removing the resist on the substrate and cleaning the substrate is also performed.

In a single-wafer substrate processing apparatus for processing substrates one at a time, a substrate is held by a substrate holding part, and a processing liquid is supplied to the substrate while rotating the substrate holding part. Various techniques are used for holding a substrate in the substrate holding part, such as vacuum chucking, mechanical chucking, or magnetic chucking. For example, U.S. Pat. No. 6,446,643 (Document 1) discloses a mechanism for clamping a substrate from above and below between upper and lower chamber members when these chamber members are arranged at positions close to each other, and releasing the clamp on the substrate when the chamber members are moved away from each other.

Japanese Patent Application Laid-Open No. 2005-19456 (Document 2) discloses a mechanism for holding and releasing the hold on a substrate by mechanically turning each of a plurality of holding members disposed around the substrate, using a motor as the power source. U.S. Pat. No. 6,485,531 (Document 3) discloses a technique for holding a wafer on a rotary head with a holding part having a spring, in an apparatus in which the rotary head rotates contactlessly relative to a stator by the magnetic force.

In the case where the substrate holding part is rotated in a floating state as with the apparatus of Document 3, it is difficult to transmit the driving force of a power source such as electricity or compressed air to the substrate holding part in order to hold the substrate. The apparatus of Document 3, in which a wafer is held by the holding part having a spring, requires complicated operations such as fixing the wafer to the rotary head outside a processing chamber and then introducing the rotary head with the wafer mounted thereon into the processing chamber.

In addition, the substrate holding part and the substrate tilt if it is attempted to release the hold on the substrate with an external force while the substrate holding part is still in the floating state. This compromises the reliability of substrate delivery.

SUMMARY OF INVENTION

The present invention is intended for a substrate processing apparatus, and it is an object of the present invention to hold a substrate with a simple structure. In particular, one object of the present invention is to hold a substrate with a simple structure even in cases where it is difficult to mechanically transmit a driving force for holding a substrate to a substrate holding part.

It is another object of the present invention to maintain a substrate in a horizontal position or reduce tilting of the substrate when releasing the hold on the substrate in a substrate processing apparatus in which the substrate holding part is rotated in a floating state.

The substrate processing apparatus according to an aspect of the present invention includes a substrate holding part for holding a substrate, a substrate rotation mechanism for rotating the substrate holding part about a central axis perpendicular to the substrate, and a magnetic-material movement mechanism for mounting a first chucking magnetic material on the substrate holding part and removing the first chucking magnetic material from the substrate holding part, or for moving a first chucking magnetic material into close proximity to the substrate holding part and moving the first chucking magnetic material away from the substrate holding part. The substrate holding part includes a chuck support part, and at least three chuck members supported on the chuck support part.

At least three chuck members includes at least one movable chuck member whose position can be changed between a chuck position and an unchuck position. Each movable chuck member included in the at least one movable chuck member includes a second chucking magnetic material that applies a force that holds an outer edge portion of the substrate on the each movable chuck member by magnetic action between the first chucking magnetic material and the second chucking magnetic material when the first chucking magnetic material is mounted on the substrate holding part or moved into close proximity to the substrate holding part.

The substrate processing apparatus can hold a substrate with a simple structure.

Preferably, the substrate processing apparatus further includes a shield plate that faces an upper surface of the substrate. The shield plate includes the first chucking magnetic material. The magnetic-material movement mechanism is a shield-plate elevating mechanism for moving the shield plate up and down.

Preferably, the substrate rotation mechanism includes a rotor that has an annular shape centered about the central axis and includes a permanent magnet, and a stator that has an annular shape centered about the central axis and rotates the rotor that is in a floating state.

A substrate processing apparatus according to another aspect of the present invention includes a substrate holding part for holding a substrate, a substrate rotation mechanism for rotating the substrate holding part about a central axis perpendicular to the substrate, and an unchucking part for releasing the hold on the substrate by the substrate holding part. The substrate rotation mechanism includes a rotor that has an annular shape centered about the central axis and includes a permanent magnet, and a stator that has an annular shape centered about the central axis and rotates the rotor that is in a floating state, The substrate holding part includes a chuck support part, and at least three chuck members that are supported on the chuck support part. At least three chuck members includes at least one fixed chuck member that is fixed to the chuck support part, and at least one movable chuck member whose position can be changed between a chuck position and an unchuck position. When the substrate is held by the substrate holding part, a force that holds an outer edge portion of the substrate acts on the at least one movable chuck member.

The unchucking part includes a contact part, a contact-part movement mechanism for moving the contact part in a direction along the central axis such that the contact part contacts with and pushes the at least one movable chuck member to change the position of the at least one movable chuck member from the chuck position to the unchuck position, and an anti-tilt part for preventing tilting of the chuck support part while the contact part is in contact with the at least one movable chuck member.

In a preferable example of the substrate processing apparatus, the unchucking part includes, as the anti-tilt part, another contact part, and a second contact-part movement mechanism for moving the another contact part in a direction along the central axis and pushing the another contact part into contact with the chuck support part or the at least one fixed chuck member to maintain a holding-part central axis in parallel with the central axis of the substrate rotation mechanism, the holding-part central axis being a central axis of the substrate holding part.

The substrate processing apparatus can thus maintain the substrate in a horizontal position when releasing the hold on the substrate.

In another preferable example of the substrate processing apparatus, the unchucking part includes, as the anti-tilt part, an anti-tilt member whose position relative to the stator is fixed or can be fixed and that prevents tilting of the chuck support part by coming in contact with the chuck support part or a portion whose position relative to the chuck support part is fixed, while the contact part is in contact with the at least one movable chuck member.

The substrate processing apparatus can thus reduce tilting of the substrate when releasing the hold on the substrate.

Preferably, the unchucking part further includes a retracting mechanism for retracting the anti-tilt member from a rotating portion when the substrate is rotated along with the substrate holding part.

These and other objects, features, aspects and advantages of the present invention will become more apparent from the following detailed description of the present invention when taken in conjunction with the accompanying drawings.

DESCRIPTION OF EMBODIMENTS

Figure 1:
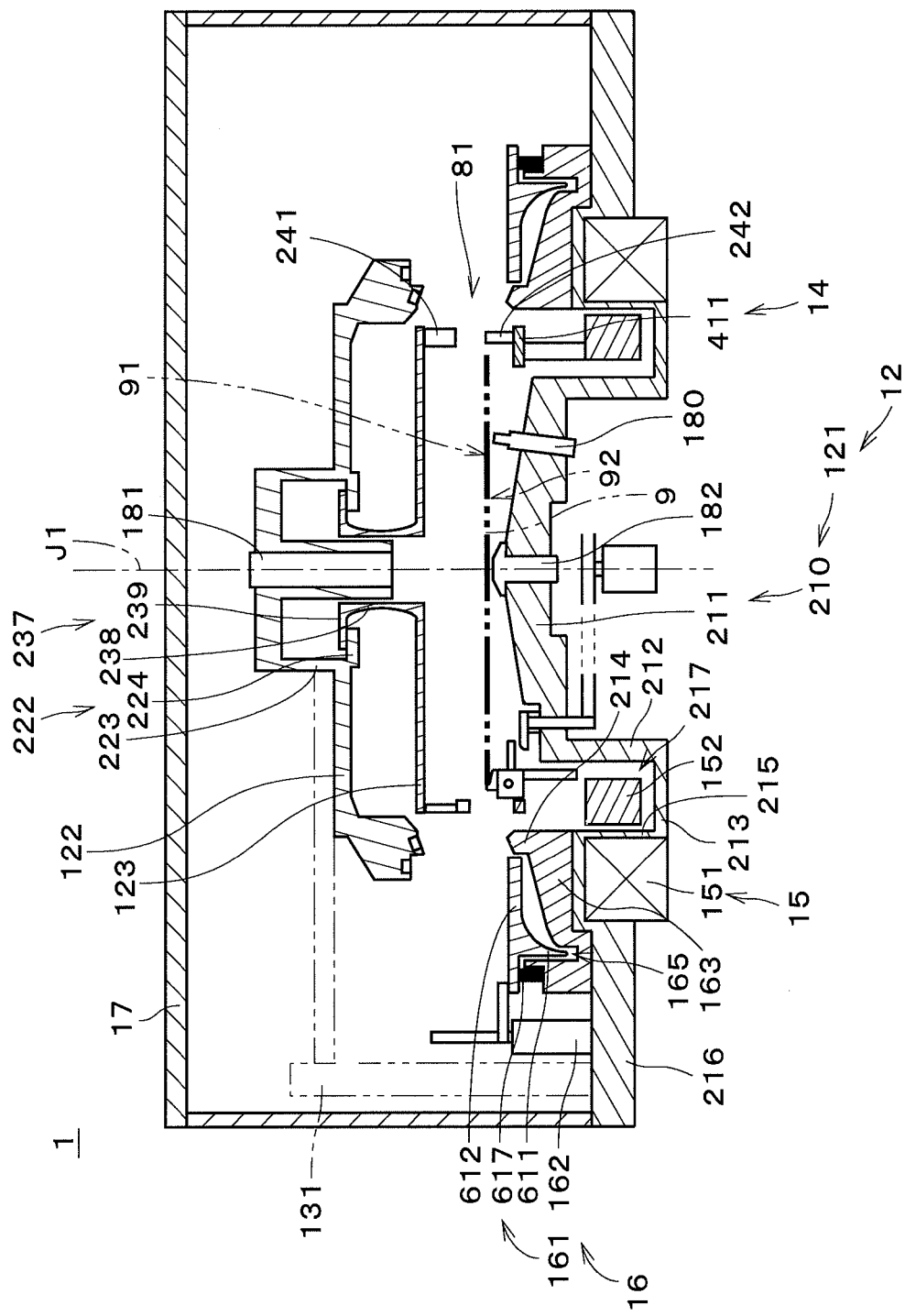
FIG. 1 is a cross-sectional view of a substrate processing apparatus according to an embodiment.

FIG. 1 is a cross-sectional view of a substrate processing apparatus 1 according to an embodiment of the present invention. The substrate processing apparatus 1 is a single-wafer processing apparatus that supplies a processing liquid to approximately disc-shaped semiconductor substrates 9 (hereinafter, simply referred to as "substrates 9") and processes the substrates 9 one at a time. In the present embodiment, the substrate processing apparatus 1 processes an approximately disc-shaped substrate 9 having a diameter of 300 mm. In FIG. 1, diagonal hatching has been omitted from the cross-sections of some of the constituent elements of the substrate processing apparatus 1 (the same applies to the other cross-sectional views).

The substrate processing apparatus 1 includes a chamber 12, a shield plate 123, a chamber opening-and-closing mechanism 131, a substrate holding part 14, a substrate rotation mechanism 15, a liquid receiving part 16, and a cover 17. The cover 17 covers the top and sides of the chamber 12.

The chamber 12 includes a chamber body 121 and a chamber lid part 122. The chamber 12 has an approximately cylindrical shape centered about a central axis J1 extending in an up-down direction. The chamber body 121 includes a chamber bottom part 210 and a chamber side-wall part 214. The chamber bottom part 210 includes an approximately disc-shaped central part 211, an approximately cylindrical inner side-wall part 212 that extends downward from the outer edge of the central part 211, an approximately annular plate-like annular bottom part 213 that extends radially outward from the lower end of the inner side-wall part 212, an approximately cylindrical outer side-wall part 215 that extends upward from the outer edge of the annular bottom part 213, and an approximately annular plate-like base part 216 that extends radially outward from the upper end of the outer side-wall part 215.

The chamber side-wall part 214 has an annular shape centered about the central axis J1. The chamber side-wall part 214 projects upward from the inner edge portion of the base part 216. As will be described later, a member that forms the chamber side-wall part 214 also forms part of the liquid receiving part 16. In the following description, a space surrounded by the chamber side-wall part 214, the outer side-wall part 215, the annular bottom part 213, the inner side-wall part 212, and the outer edge of the central part 211 is referred to as a "lower annular space 217."

When the substrate 9 is held by the substrate holding part 14, a lower surface 92 of the substrate 9 faces the upper surface of the central part 211 of the chamber bottom part 210. In the following description, the central part 211 of the chamber bottom part 210 is referred to as a "lower-surface opposing part 211."

The chamber lid part 122 has an approximately disc shape perpendicular to the central axis J1, and includes an upper part of the chamber 12. The chamber lid part 122 closes an upper opening of the chamber body 121. FIG. 1 illustrates a state in which the chamber lid part 122 is spaced from the chamber body 121. When the chamber lid part 122 closes the upper opening of the chamber body 121, the outer edge portion of the chamber lid part 122 comes in contact with the upper portion of the chamber side-wall part 214.

The chamber opening-and-closing mechanism 131 moves the chamber lid part 122, which serves as a movable part of the chamber 12, relative to the chamber body 121, which is the other part of the chamber 12, in the up-down direction. The chamber opening-and-closing mechanism 131 is a lid elevating mechanism for moving the chamber lid part 122 up and down. When the chamber lid part 122 is moved in the up-down direction by the chamber opening-and-closing mechanism 131, the shield plate 123 is also moved along with the chamber lid part 122 in the up-down direction. That is, the chamber opening-and-closing mechanism 131 is also a shield-plate elevating mechanism. Bringing the chamber lid part 122 into contact with the chamber body 121 to close the upper opening and pushing the chamber lid part 122 against the chamber body 121 forms a chamber space 120 (see FIG. 6), which is an inner space sealed inside the chamber 12. In other words, the chamber space 120 is sealed by closing the upper opening of the chamber body 121 with the chamber lid part 122. The chamber lid part 122 and the chamber body 121 constitute a sealed-space forming part that forms the sealed chamber space 120.

The substrate holding part 14 is disposed in the chamber space 120 and holds the substrate 9 in a horizontal position. That is, the substrate 9 is held by the substrate holding part 14, with its one main surface on which a fine pattern is formed (hereinafter, referred to as an upper surface 91) facing upward in a direction perpendicular to the central axis J1. The substrate holding part 14 includes a chuck support part 411 and a plurality of chuck members. The chuck support part 411 has an annular plate-like shape centered about the central axis J1. The plurality of chuck members are supported on the chuck support part 411. The details of the chuck members will be described later.

The shield plate 123 has an approximately disc shape perpendicular to the central axis J1. The shield plate 123 is disposed below the chamber lid part 122 and above the substrate holding part 14. The shield plate 123 has an opening at the center. When the substrate 9 is supported by the substrate holding part 14, the upper surface 91 of the substrate 9 faces the lower surface of the shield plate 123 that is perpendicular to the central axis J1. The shield plate 123 has a greater diameter than the substrate 9, and the outer peripheral edge of the shield plate 123 is located radially outward of the outer peripheral edge of the substrate 9 throughout the periphery.

In the state illustrated in FIG. 1, the shield plate 123 is supported by the chamber lid part 122 in a hanging manner. The chamber lid part 122 includes an approximately annular plate holding part 222 at the central portion. The plate holding part 222 includes a cylindrical part 223 that has an approximately cylindrical shape centered about the central axis J1, and a flange part 224 that has an approximately disc shape centered about the central axis J1. The flange part 224 extends radially inward from the lower end of the cylindrical part 223.

The shield plate 123 includes a held part 237 having an annular shape. The held part 237 includes a cylindrical part 238 that has an approximately cylindrical shape centered about the central axis J1, and a flange part 239 that has an approximately disc shape centered about the central axis J1. The cylindrical part 238 extends upward from the upper surface of the shield plate 123. The flange part 239 extends radially outward from the upper end of the cylindrical part 238. The cylindrical part 238 is located radially inward of the cylindrical part 223 of the plate holding part 222. The flange part 239 is located above the flange part 224 of the plate holding part 222 and faces the flange part 224 in the up-down direction. When the lower surface of the flange part 239 of the held part 237 comes in contact with the upper surface of the flange part 224 of the plate holding part 222, the shield plate 123 is supported by the chamber lid part 122 so as to hang from the chamber lid part 122.

The lower surface of the outer edge portion of the shield plate 123 has a plurality of first engagement parts 241 arranged in the circumferential direction. The upper surface of the chuck support part 411 has a plurality of second engagement part 242 arranged in the circumferential direction. Three or more sets of these engagements parts are preferably provided, and in the present embodiments, there are four sets of engagement parts. The bottom of each first engagement part 241 has a recessed portion that is recessed upward. The second engagement parts 242 project upward from the chuck support part 411. The first engagement parts 241 and the second engagement part 242 are disposed at different positions from the chuck members, which will be described later, in the circumferential direction.

The substrate rotation mechanism 15 is commonly called a hollow motor, and rotates the substrate holding part 14 about the central axis J1 perpendicular to the substrate 9. The substrate rotation mechanism 15 includes an annular stator 151 centered about the central axis J1, and an annular rotor 152. The rotor 152 includes an approximately annular permanent magnet. The surface of the permanent magnet is molded of a PTFE resin. The rotor 152 is disposed in the lower annular space 217 of the chamber 12. The chuck support part 411 is disposed above the rotor 152. The chuck support part 411 is attached to the rotor 152 via a connection member.

The stator 151 is disposed around the rotor 152 outside the chamber 12, i.e., disposed radially outward of the rotor 152. In the present embodiment, the stator 151 is fixed to the outer side-wall part 215 and the base part 216 of the chamber bottom part 210 and located below the liquid receiving part 16. The stator 151 includes a plurality of coils arranged in the circumferential direction centered about the central axis J1.

Supplying current to the stator 151 generates a torque about the central axis J1 between the stator 151 and the rotor 152. This causes the rotor 152 to rotate in a horizontal position about the central axis J1. The magnetic force between the stator 151 and the rotor 152 allows the rotor 152 to float in the chamber 12 without direct or indirect contact with the chamber 12 and rotate the substrate 9 along with the substrate holding part 14 about the central axis J1 in a floating state.

The liquid receiving part 16 includes a cup part 161, a cup-part movement mechanism 162, and a cup opposing portion 163. The cup part 161 has an annular shape centered about the central axis J1 and is located radially outward of the chamber 12 throughout the periphery. The cup-part movement mechanism 162 moves the cup part 161 in the up-down direction. The cup-part movement mechanism 162 is disposed radially outward of the cup part 161. The cup-part movement mechanism 162 is disposed at a different position from the aforementioned chamber opening-and-closing mechanism 131 in the circumferential direction. The cup opposing portion 163 is located below the cup part 161 and faces the cup part 161 in the up-down direction. The cup opposing portion 163 is part of the member that forms the chamber side-wall part 214. The cup opposing portion 163 includes an annular liquid receiving recessed portion 165 that is located radially outward of the chamber side-wall part 214.

The cup part 161 includes a side wall part 611, an upper surface part 612, and a bellows 617. The side wall part 611 has an approximately cylindrical shape centered about the central axis J1. The upper surface part 612 has an approximately annular plate-like shape centered about the central axis J1, and extends radially inward and outward from the upper end of the side wall part 611. The lower portion of the side wall part 611 is located within the liquid receiving recessed portion 165 of the cup opposing portion 163.

The bellows 617 has an approximately cylindrical shape centered about the central axis J1 and is extendable in the up-down direction. The bellows 617 is provided radially outward of the side wall part 611 throughout the periphery of the side wall part 611. The bellows 617 is formed of a material that prevents passage of gases and liquids. The upper end of the bellows 617 is connected to the lower surface of the outer edge portion of the upper surface part 612 throughout the periphery. In other words, the upper end of the bellows 617 is indirectly connected to the side wall part 611 via the upper surface part 612. The connection between the bellows 617 and the upper surface part 612 is sealed to prevent passage of gases and liquids. The lower end of the bellows 617 is indirectly connected to the chamber body 121 via the cup opposing portion 163. The connection between the lower end of the bellows 617 and the cup opposing portion 163 also prevents passage of gases and liquids.

The chamber lid part 122 has an upper nozzle 181 attached at the center, the upper nozzle 181 having an approximately columnar shape centered about the central axis J1. The upper nozzle 181 is fixed to the chamber lid part 122, facing the central portion of the upper surface 91 of the substrate 9. The upper nozzle 181 can be inserted into the center opening of the shield plate 123. The lower-surface opposing part 211 of the chamber bottom part 210 has a lower nozzle 182 attached at the center. The lower nozzle 182 has a liquid outlet at the center and faces the central portion of the lower surface 92 of the substrate 9. The lower-surface opposing part 211 further has a plurality of heated-gas supply nozzles 180 attached thereto. For example, the heated-gas supply nozzles 180 are arranged at equal intervals in the circumferential direction centered about the central axis J1.

Figure 2:
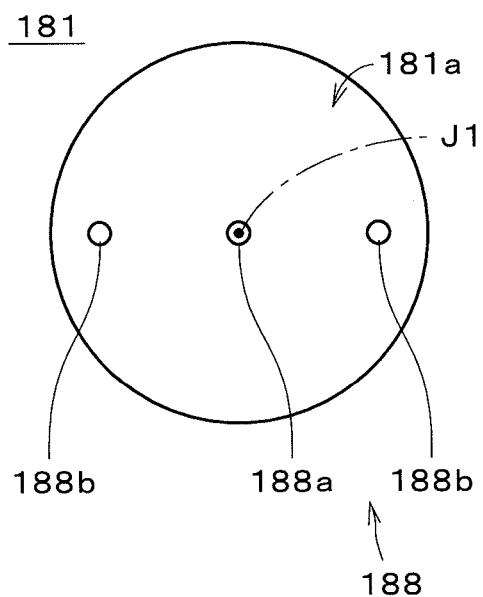
FIG. 2 is a bottom view of an upper nozzle.

FIG. 2 is a bottom view of the upper nozzle 181. A bottom surface 181a of the upper nozzle 181 has an approximately circular shape centered about the central axis J1. The bottom surface 181a has a plurality of outlets 188 from which liquids are ejected. The outlets 188 include a central outlet 188a that is disposed at the center of the bottom surface 181a (i.e., approximately on the central axis J1), and a plurality of peripheral outlets 188b that are disposed around the central outlet 188a. The peripheral outlets 188b are disposed at equal intervals on a single circle centered about the central axis J1. In the example in FIG. 2, two peripheral outlets 188b are disposed at intervals of 180 degrees in the circumferential direction centered about the central axis J1.

Figure 3:
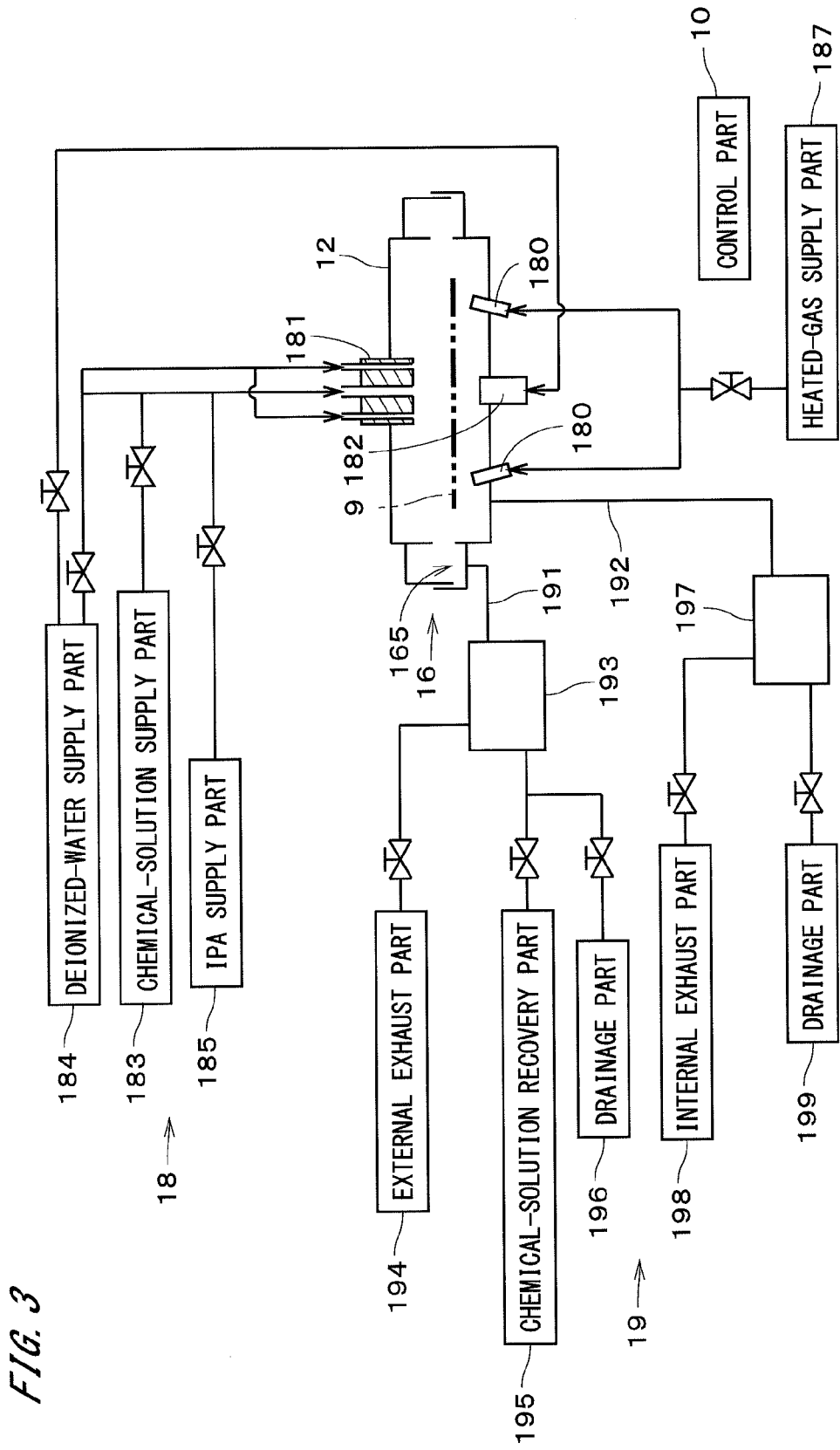
FIG. 3 is a block diagram illustrating a gas-liquid supply part and a gas-liquid discharge part.

FIG. 3 is a block diagram of a gas-liquid supply part 18 and a gas-liquid discharge part 19 of the substrate processing apparatus 1. The gas-liquid supply part 18 includes, in addition to the upper nozzle 181, the lower nozzle 182, and the heated-gas supply nozzles 180 that are described above, a chemical-solution supply part 183, a deionized-water supply part 184, an IPA supply part 185, and a heated-gas supply part 187.

The chemical-solution supply part 183 is connected to the upper nozzle 181 via a valve. The deionized-water supply part 184 and the IPA supply part 185 are connected to the upper nozzle 181 via different valves. The lower nozzle 182 is connected to the deionized-water supply part 184 via a valve. The plurality of heated-gas supply nozzles 180 are connected to the heated-gas supply part 187 via a valve.

A first exhaust passage 191 that is connected to the liquid receiving recessed portion 165 of the liquid receiving part 16 is connected to a gas-liquid separation part 193. The gas-liquid separation part 193 is connected to an external exhaust part 194, a chemical-solution recovery part 195, and a drainage part 196 via different valves. A second exhaust passage 192 that is connected to the chamber bottom part 210 of the chamber 12 is connected to a gas-liquid separation part 197. The gas-liquid separation part 197 is connected to an internal exhaust part 198 and a drainage part 199 via different valves. Constituent elements of the gas-liquid supply part 18 and the gas-liquid discharge part 19 are controlled by a control part 10. The chamber opening-and-closing mechanism 131, the substrate rotation mechanism 15, and the cup-part movement mechanism 162 (see FIG. 1) are also controlled by the control part 10.

A chemical solution supplied from the chemical-solution supply part 183 to the upper nozzle 181 is ejected toward the central portion of the upper surface 91 of the substrate 9 from the central outlet 188a (see FIG. 2) of the upper nozzle 181. The chemical solution supplied from the chemical-solution supply part 183 to the substrate 9 through the upper nozzle 181 is, for example, a processing liquid for processing a substrate using chemical reactions, an example of which is an etchant such as hydrofluoric acid or an aqueous solution of tetramethyl ammonium hydroxide.

The deionized-water supply part 184 supplies deionized water (DIW) to the substrate 9 through the upper nozzle 181 and the lower nozzle 182. The deionized water supplied from the deionized-water supply part 184 to the upper nozzle 181 is ejected toward the central portion of the upper surface 91 of the substrate 9 in an ejection direction that is approximately perpendicular to the upper surface 91, from the plurality of outlets 188 (i.e., the central outlet 188a and the peripheral outlets 188b) of the upper nozzle 181. The deionized water supplied from the deionized-water supply part 184 to the lower nozzle 182 is ejected toward the central portion of the lower surface 92 of the substrate 9 from the outlets of the lower nozzle 182.

Isopropyl alcohol (IPA) supplied from the IPA supply part 185 to the upper nozzle 181 is ejected toward the central portion of the upper surface 91 of the substrate 9 from the central outlet 188a of the upper nozzle 181. The substrate processing apparatus 1 may also include other processing liquid supply parts for supplying processing liquids other than the aforementioned processing liquids (chemical solution, deionized water, and IPA).

The heated-gas supply part 187 supplies a heated gas (e.g., a high-temperature inert gas) to the lower surface 92 of the substrate 9 through the plurality of heated-gas supply nozzles 180. In the present embodiment, the heated-gas supply part 187 uses a nitrogen ($N_2$) gas, but gases other than the nitrogen gas may be used. In the case of using a heated inert gas in the heated-gas supply part 187, measures taken by the substrate processing apparatus 1 against explosion can be simplified or eliminated. Since the substrate rotation mechanism 15 of the substrate processing apparatus 1 is a hollow motor, in particular, a rotor-floating motor having a large opening at the center, various types of nozzles and heaters can be easily provided below the substrate 9.

Figure 4:
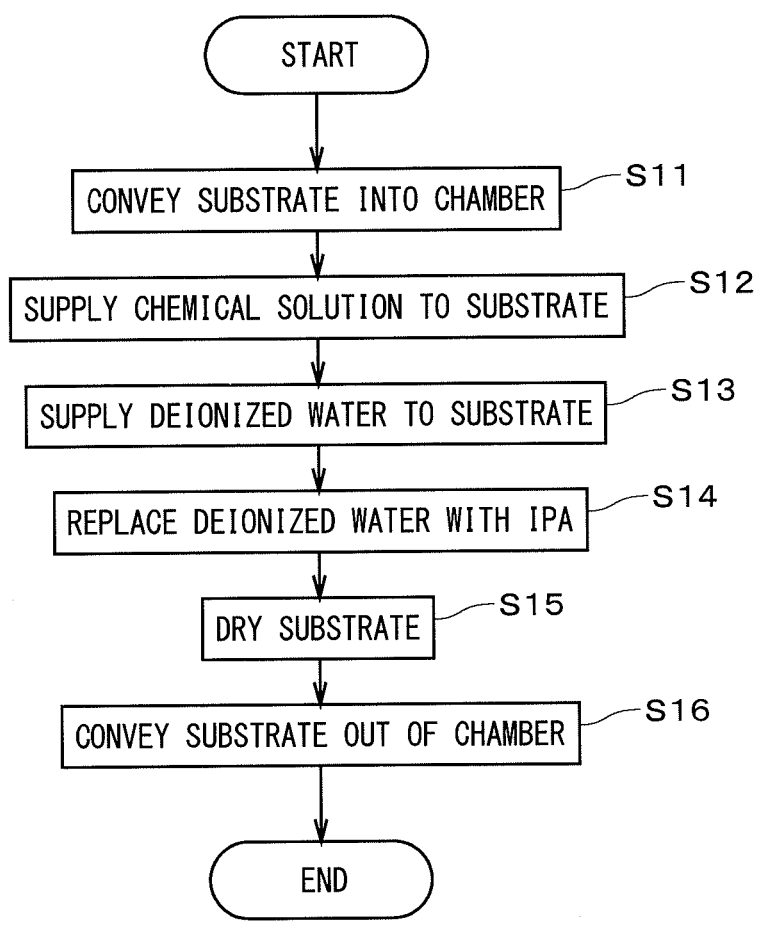
FIG. 4 is a flowchart of processing performed by the substrate processing apparatus.

FIG. 4 is a flowchart of processing performed on the substrate 9 by the substrate processing apparatus 1. In the substrate processing apparatus 1, when the chamber lid part 122 is spaced from the chamber body 121 at a position thereabove and the cup part 161 is spaced from the chamber lid part 122 at a position therebelow as illustrated in FIG. 1, the substrate 9 is conveyed into the chamber 12 by an external conveying mechanism and supported from the bottom by the substrate holding part 14 (step S11). The state in which the chamber 12 and the cup part 161 are as illustrated in FIG. 1 is hereinafter referred to as an "open state." An opening between the chamber lid part 122 and the chamber side-wall part 214 has an annular shape centered about the central axis J1 and is hereinafter referred to as an "annular opening 81." In the substrate processing apparatus 1, moving the chamber lid part 122 away from the chamber body 121 forms the annular opening 81 around the substrate 9 (i.e., radially outward of the substrate 9). In step S11, the substrate 9 is conveyed through the annular opening 81.

Figure 5:
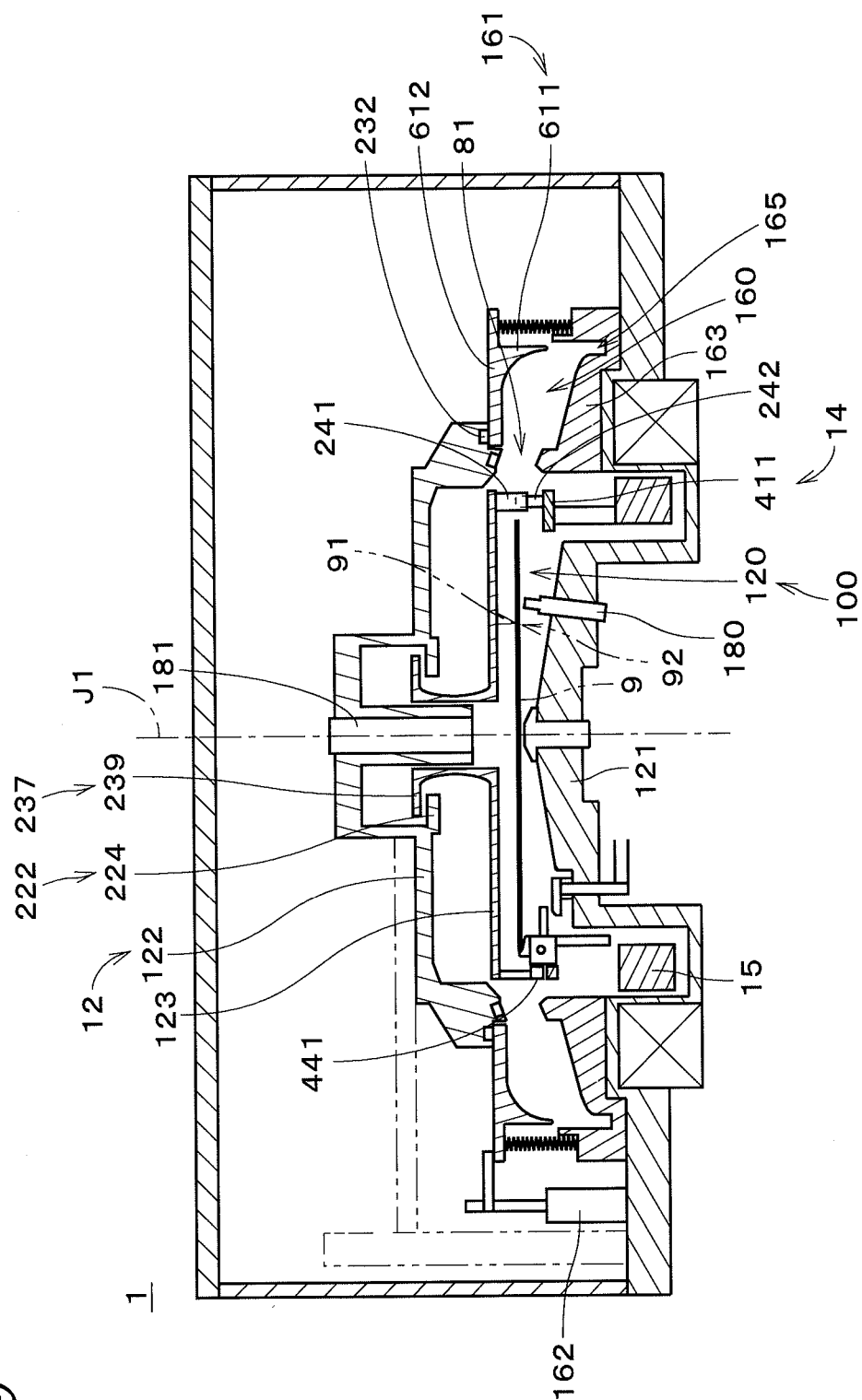
FIG. 5 is a cross-sectional view of the substrate processing apparatus.

After the substrate 9 has been conveyed into the chamber, the cup part 161 is moved from the position in FIG. 1 up to the position in FIG. 5 to be located radially outward of the annular opening 81 throughout the periphery. In the following description, the state in which the chamber 12 and the cup part 161 are as illustrated in FIG. 5 is referred to as a "first sealed state." The position of the cup part 161 in FIG. 5 is referred to as a "liquid-receiving position" and the position of the cup part 161 in FIG. 1 is referred to as a "retracted position." The cup-part movement mechanism 162 moves the cup part 161 in the up-down direction between the liquid-receiving position, which is radially outward of the annular opening 81, and the retracted position, which is below the liquid-receiving position.

When the cup part 161 is located at the liquid-receiving position, the side wall part 611 faces the annular opening 81 in the radial direction. Also, the upper surface of the inner edge portion of the upper surface part 612 comes in contact with a rip seal 232, which is provided at the bottom of the outer edge portion of the chamber lid part 122, throughout the periphery. A seal part that prevents passage of gases and liquids is formed between the chamber lid part 122 and the upper surface part 612 of the cup part 161. This forms a sealed space (hereinafter, referred to as an "enlarged sealed space 100") that is surrounded by the chamber body 121, the chamber lid part 122, the cup part 161, and the cup opposing portion 163. The enlarged sealed space 100 is a single space formed by communication of the chamber space 120, which is formed between the chamber lid part 122 and the chamber body 121, and a side space 160, which is surrounded by the cup part 161 and the cup opposing portion 163, through the annular opening 81.

In the first sealed state, the substrate 9 is held by the substrate holding part 14 using a force received from first chucking magnetic materials 441 provided on the shield plate 123. The mechanism for holding the substrate 9 will be described later. A plurality of pairs of magnets (not shown), the magnets in each pair facing each other in the up-down direction, are provided on the lower surface of the shield plate 123 and on the chuck support part 411. Hereinafter, each pair of magnets is also referred to as a "magnet pair." In the substrate processing apparatus 1, the magnet pairs are disposed at equal intervals in the circumferential direction. When the first engagement parts 241 and the second engagement parts 242 are engaged with each other, a downward force is exerted on the shield plate 123 by the magnetic force (attractive force) between the magnets in each pair.

In the first sealed state, the flange part 239 of the held part 237 is located above and away from the flange part 224 of the plate holding part 222, i.e., the plate holding part 222 is not in contact with the held part 237. In other words, the hold on the shield plate 123 by the plate holding part 222 is released. The shield plate 123 is thus rotated independently of the chamber lid part 122 by the substrate rotation mechanism 15, along with the substrate holding part 14 and the substrate 9 held by the substrate holding part 14.

In the first sealed state, the second engagement parts 242 fit in the recessed portions at the bottoms of the first engagement parts 241, and accordingly, the shield plate 123 is engaged with the chuck support part 411 in the circumferential direction about the central axis J1. In other words, the first engagement parts 241 and the second engagement parts 242 constitute a position fixing member that fixes the position of the shield plate 123 relative to the substrate holding part 14 in the rotational direction (i.e., fixes the position of the shield plate 123 relative to the substrate holding part 14 in the circumferential direction). When the chamber lid part 122 is moved down, the substrate rotation mechanism 15 controls the rotating position of the chuck support part 411 such that the first engagement parts 241 and the second engagement parts 242 fit together.

Next, the substrate rotation mechanism 15 starts rotating the substrate 9 at a constant rotational speed (a relatively low rotational speed, which is hereinafter referred to as a "steady-state rotational speed"). Then, the heated gas is ejected from the plurality of heated-gas supply nozzles 180 toward the lower surface 92 of the substrate 9, and the external exhaust part 194 starts exhausting the gas in the enlarged sealed space 100. This heats the substrate 9. Then, the supply of a chemical solution from the central outlet 188a (see FIG. 2) of the upper nozzle 181 toward the central portion of the upper surface 91 of the rotating substrate 9 is started (step S12). Here, the chemical solution is ejected to only the central portion of the upper surface 91 of the substrate 9, and is not ejected to the other portions of the upper surface 91. The chemical solution ejected from the upper nozzle 181 is continuously supplied to the upper surface 91 of the rotating substrate 9. The chemical solution on the upper surface 91 spreads toward the periphery of the substrate 9 due to the rotation of the substrate 9, and the entire upper surface 91 is covered with the chemical solution.

During the supply of the chemical solution from the upper nozzle 181, the heated gas also continues to be ejected from the heated-gas supply nozzles 180. Thus, the upper surface 91 is etched with the chemical solution while the substrate 9 is heated to approximately a desired temperature. This consequently improves the uniformity of chemical-solution processing performed on the substrate 9. Since the lower surface of the shield plate 123 is in close proximity to the upper surface 91 of the substrate 9, the etching of the substrate 9 is performed in an extremely narrow space between the lower surface of the shield plate 123 and the upper surface 91 of the substrate 9.

In the enlarged sealed space 100, the chemical solution that disperses from the upper surface 91 of the rotating substrate 9 is received by the cup part 161 through the annular opening 81 and guided to the liquid receiving recessed portion 165. The chemical solution guided to the liquid receiving recessed portion 165 flows into the gas-liquid separation part 193 through the first exhaust passage 191 in FIG. 3. The chemical-solution recovery part 195 recovers the chemical solution from the gas-liquid separation part 193 and removes impurities and other unnecessary substances from the chemical solution, using a filter, for example, for reuse.

After a predetermined period of time (e.g., 60 to 120 seconds) has elapsed since the start of supply of the chemical solution from the upper nozzle 181, the supply of the chemical solution from the upper nozzle 181 and the supply of the heated gas from the heated-gas supply nozzles 180 are stopped. Then, the substrate rotation mechanism 15 increases the rotational speed of the substrate 9 for a predetermined period of time (e.g., one to three seconds) to be higher than the steady-state rotational speed to remove the chemical solution from the substrate 9.

Figure 6:
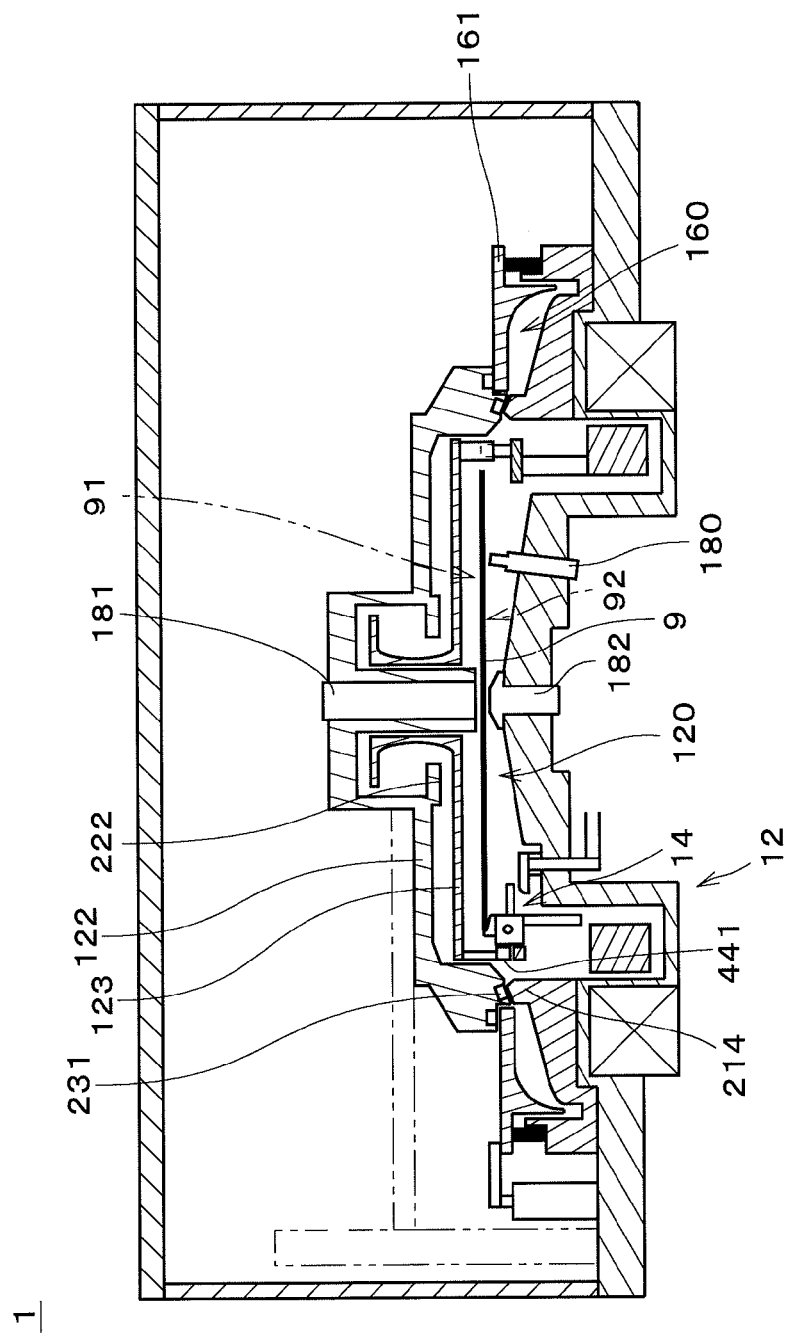
FIG. 6 is a cross-sectional view of the substrate processing apparatus.

Then, the chamber lid part 122 and the cup part 161 are moved downward while remaining in contact with each other. When the rip seal 231 at the bottom of the outer edge portion of the chamber lid part 122 comes in contact with the upper portion of the chamber side-wall part 214 as illustrated in FIG. 6, the annular opening 81 is closed so that the chamber space 120 is sealed and isolated from the side space 160. The cup part 161 is located at the retracted position as in FIG. 1. Hereinafter, the state in which the chamber 12 and the cup part 161 are as illustrated in FIG. 6 is referred to as a "second sealed state." In the second sealed state, the substrate 9 directly faces the inner wall of the chamber 12, and no other liquid-receiving parts are present therebetween.

In the second sealed state, the substrate 9 is held by the substrate holding part 14 using the force received from the first chucking magnetic materials 441, as in the first sealed state. The hold on the shield plate 123 by the plate holding part 222 is released, and the shield plate 123 rotates independently of the chamber lid part 122, along with the substrate holding part 14 and the substrate 9.

When the chamber space 120 is sealed, the external exhaust part 194 (see FIG. 3) stops exhausting the gas, and the internal exhaust part 198 starts exhausting the gas in the chamber space 120. Then, the deionized-water supply part 184 starts supplying deionized water to the substrate 9 (step S13).

The deionized water supplied from the deionized-water supply part 184 is continuously supplied to the central portion of the upper surface 91 of the substrate 9 from the plurality of outlets 188 (see FIG. 2) of the upper nozzle 181. The deionized water supplied from the deionized-water supply part 184 is also continuously supplied to the central portion of the lower surface 92 of the substrate 9 from the lower nozzle 182. The deionized water ejected from the upper nozzle 181 and the lower nozzle 182 is supplied as a cleaning liquid to the substrate 9.

The deionized water spreads toward the peripheries of the upper and lower surfaces 91 and 92 of the substrate 9 due to the rotation of the substrate 9 as illustrated in FIG. 6, and disperses to the outside from the outer edge of the substrate 9. The deionized water that disperses from the substrate 9 is received by the inner wall of the chamber 12 (i.e., the inner walls of the chamber lid part 122 and the chamber side-wall part 214) and discarded through the second exhaust passage 192, the gas-liquid separation part 197, and the drainage part 199, which are illustrated in FIG. 3 (the same applies to processing for drying the substrate 9, which will be described later). Accordingly, the cleaning of the chamber 12 is substantially performed in the chamber space 120, along with the processing for cleaning the substrate 9 with deionized water.

After a predetermined period of time has elapsed since the start of supply of deionized water, the supply of deionized water from the deionized-water supply part 184 is stopped. Then, the heated gas is ejected toward the lower surface 92 of the substrate 9 from the plurality of heated-gas supply nozzles 180. This heats the substrate 9.

Then, IPA is supplied from the upper nozzle 181 to the upper surface 91 of the substrate 9 to replace deionized water with IPA on the upper surface 91 (step S14). After a predetermined period of time has elapsed since the start of supply of IPA, the supply of IPA from the IPA supply part 185 is stopped. Thereafter, the rotational speed of the substrate 9 is increased to be sufficiently higher than the steady-state rotational speed while the heated gas continues to be ejected from the heated-gas supply nozzles 180. This removes IPA from above the substrate 9, drying the substrate 9 (step S15). After a predetermined period of time has elapsed since the start of drying the substrate 9, the rotation of the substrate 9 is stopped. The processing for drying the substrate 9 may be performed under a reduced pressure of the chamber space 120 that is reduced by the internal exhaust part 198 to be lower than atmospheric pressure.

Thereafter, the chamber lid part 122 and the shield plate 123 are moved upward so that the chamber 12 is in the open state as illustrated in FIG. 1. In step S15, little liquid remains on the lower surface of the shield plate 123 because the shield plate 123 rotates along with the substrate holding part 14. This eliminates the possibility that a liquid will drop from the shield plate 123 onto the substrate 9 during upward movement of the chamber lid part 122. The substrate 9 is conveyed out of the chamber 12 by an external conveying mechanism (step S16).

Next, a chucking mechanism of the substrate holding part 14 will be described. As described previously, the substrate holding part 14 includes the chuck support part 411 and the plurality of chuck members. In the present embodiment, two movable chuck members and two fixed chuck members are provided as the chuck members. Each movable chuck member has the same configuration, and each fixed chuck member has the same configuration.

Figure 7:
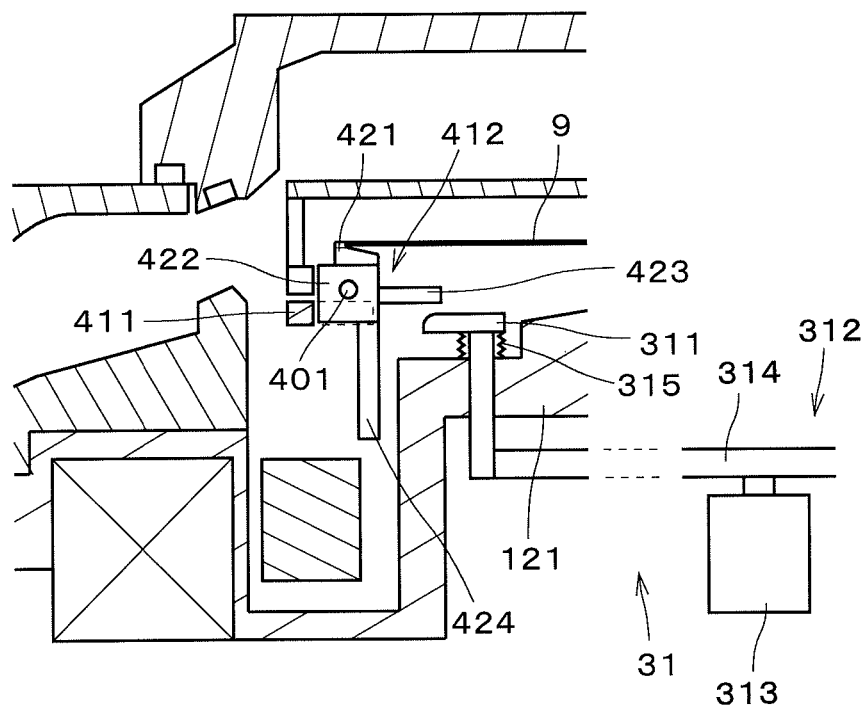
FIG. 7 is a cross-sectional view of the substrate processing apparatus.

FIG. 7 is a longitudinal cross-sectional view of the substrate processing apparatus 1 in the vicinity of one movable chuck member 412, illustrating a state in which the substrate 9 is held. The movable chuck member 412 is supported on the chuck support part 411 and includes a hook part 421, a base part 422, a lever part 423, and a pendent part 424. The hook part 421 is in contact with the substrate 9. The hook part 421 is fixed to the base part 422. The base part 422 is supported to be turnable about a turning axis 401. The position of the turning axis 401 is fixed relative to the chuck support part 411. The turning axis 401 is perpendicular to the central axis J1. Circular movement of the base part 422 causes the hook part 421 to move in the radial direction about the central axis J1. The lever part 423 extends radially inward from the base part 422. The pendent part 424 extends downward from the base part 422.

Figure 8:
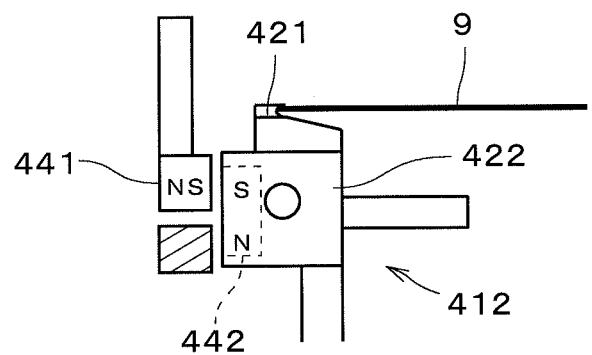
FIG. 8 is an enlarged view of a movable chuck member and a first chucking magnetic material.

FIG. 8 is an enlarged view of one movable chuck member 412 and one first chucking magnetic material 441. The base part 422 has a second chucking magnetic material 442 attached thereto. When the shield plate 123 is moved down to come in close proximity to the upper surface of the substrate 9, the first chucking magnetic material 441 and the second chucking magnetic material 442 come in close proximity to each other, and a force that moves the hook part 421 radially inward is exerted on the movable chuck member 412 by the magnetic force between the first and second chucking magnetic materials. That is, a force that holds the outer edge of the substrate 9 along with fixed chuck members, which will be described later, acts on the movable chuck member 412.

The provision of the first chucking magnetic material 441 on the shield plate 123 eliminates the need to provide a separate mechanism for moving the first chucking magnetic material 441, enabling chucking or holding of the substrate 9 with a simple structure. In addition, chucking can be easily achieved even if the rotor 152 of the substrate rotation mechanism 15 is in a floating state. Since the first chucking magnetic material 441 is provided on the member that extends downward from the shield plate 123, the possibility of the first chucking magnetic material 441 and the structure in the periphery of the first chucking magnetic material 441 preventing drainage of the processing liquid that disperses from the substrate 9 can be reduced.

Figure 9:
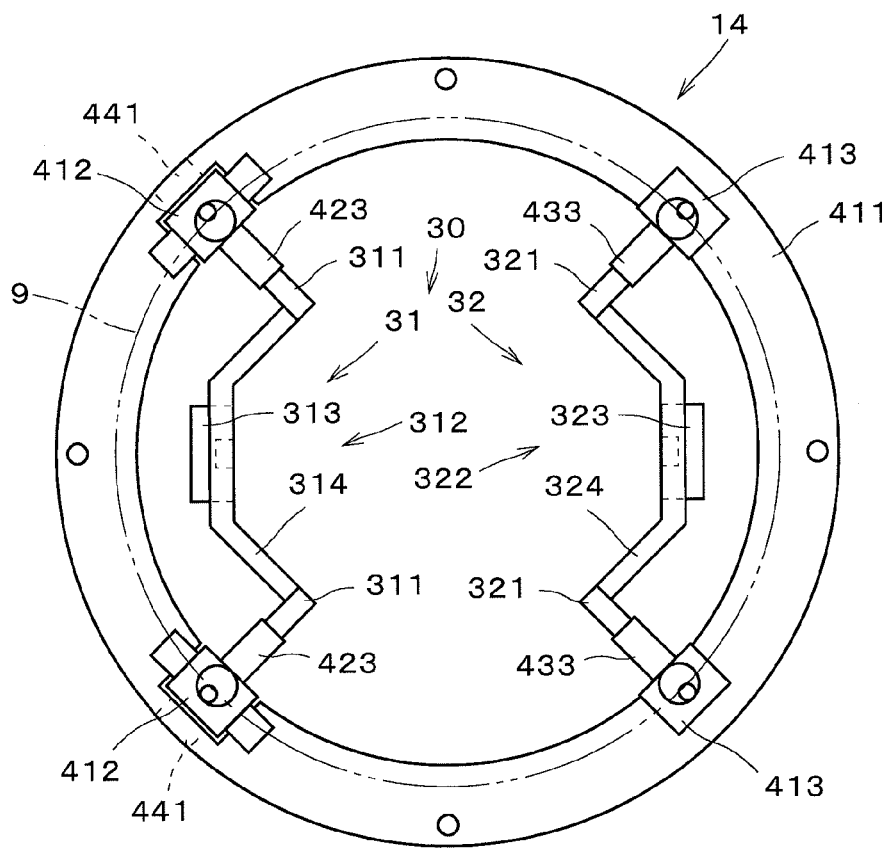
FIG. 9 is a plan view of a substrate holding part and an unchucking part.

FIG. 9 is a plan view of the substrate holding part 14 and an unchucking part 30. The two movable chuck members 412 and the two fixed chuck members 413 are provided on the chuck support part 411. The four chuck members are disposed at equal intervals in the circumferential direction. In FIG. 9, positions at which the first chucking magnetic materials 441 are to be disposed are indicated by broken lines. The unchucking part 30 includes a first pushing-up mechanism 31 and a second pushing-up mechanism 32. FIG. 7 illustrates part of the first pushing-up mechanism 31.

Figure 10:
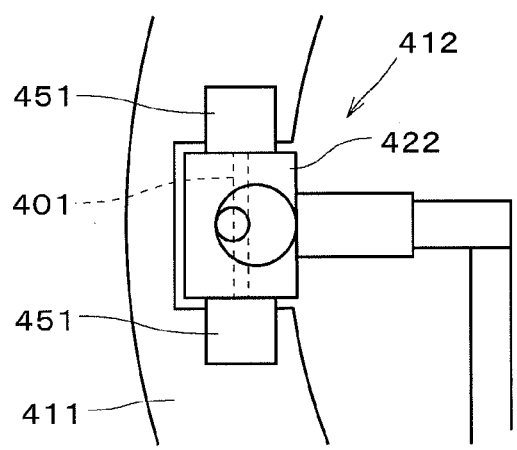
FIG. 10 is an enlarged plan view of a movable chuck member and the periphery thereof.

FIG. 10 is an enlarged plan view of one movable chuck member 412 and the vicinity thereof. The annular, plate-like chuck support part 411 has an area that is recessed radially outward from the inner periphery thereof. The movable chuck member 412 is disposed in this recessed area. On both sides of the movable chuck member 412 in the circumferential direction, support parts 451 that project upward from the body of the chuck support part 411 are provided. The turning axis 401 is fixed between the two support parts 451. The turning axis 401 penetrates through the base part 422 of the movable chuck member 412. This allows the movable chuck member 412 to be turnably supported by the chuck support part 411.

As illustrated in FIGS. 7 and 9, the first pushing-up mechanism 31 includes a first contact part 311 and a first contact-part movement mechanism 312. The first contact-part movement mechanism 312 includes a cylinder 313 with a guide, and an arm 314. The first contact part 311 is attached to the upper end of the arm 314. To separate the inside and outside of the chamber body 121, the arm 314 is covered with a bellows 315 between the first contact part 311 and the bottom of the chamber body 121. When the cylinder 313 moves the first contact part 311 upward in parallel with the central axis J1 along with the arm 314, the first contact part 311 comes in contact with the lever part 423 of the movable chuck member 412. The first contact part 311 may be moved in a direction that is not parallel to the central axis J1 as long as the direction is along the central axis J1. When the first contact part 311 is further moved and pushes the lever part 423, the movable chuck member 412 turns around the turning axis 401 so that the hook part 421 moves radially outward as illustrated in FIG. 11.

Figure 11:
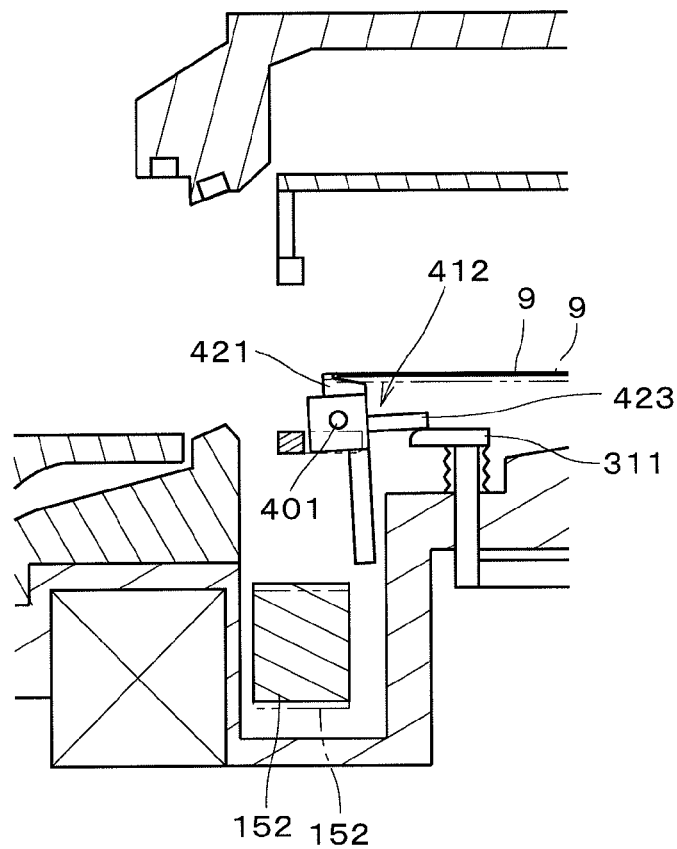
FIG. 11 is a cross-sectional view of the substrate processing apparatus.

Hereinafter, the position (to be precise, rotational position) of the movable chuck member 412 in FIG. 7 is referred to as a "chuck position." The position of the movable chuck member 412 in FIG. 11 is referred to as an "unchuck position." The position of the movable chuck member 412 is changed from the chuck position to the unchuck position by the first contact part 311 of the unchucking part 30 being moved upward and pushing the lever part 423. The unchucking part 30 releases the hold on the substrate 9 by the substrate holding part 14.

Figure 12A:
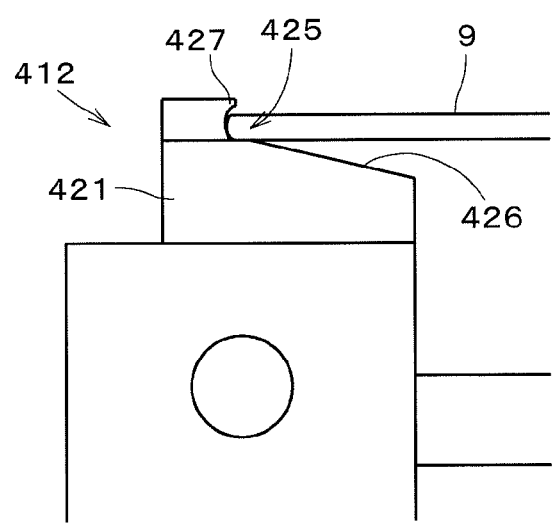
FIG. 12A illustrates a movable chuck member.
Figure 12B:
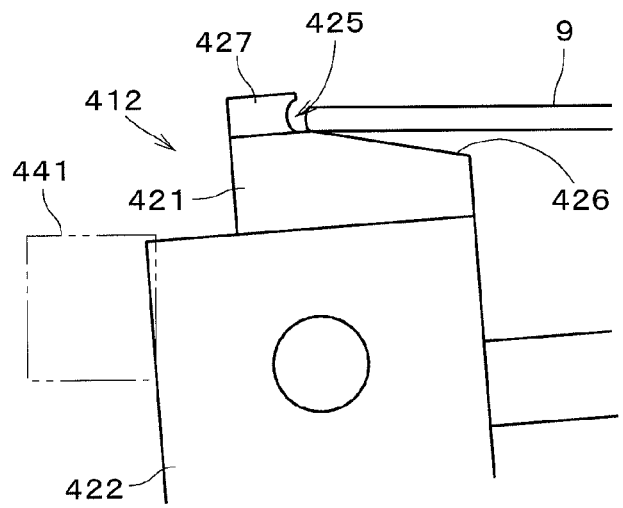
FIG. 12B illustrates the movable chuck member.

FIG. 12A illustrates the hook part 421 in a state in which the substrate 9 is held. FIG. 12B illustrates a state in which hold on the substrate 9 is released. The hook part 421 has a recessed part 425 that is recessed radially outward. The outer edge of the substrate 9 fits in the recessed part 425. The lower portion of the recessed part 425 forms an inclined surface 426 that is inclined downward and radially inward. The upper portion of the recessed part 425 forms a microprojecting part 427 that projects slightly inward in the radial direction. As illustrated in FIG. 12B, when the movable chuck member 412 is located at the unchuck position, the substrate 9 is supported on the inclined plane 426, and when the substrate 9 is lifted up, the outer edge of the substrate 9 can pass through the inside of the inner edge of the microprojecting part 427.

In FIG. 12B, the position of the first chucking magnetic material 441 when moved downward is indicated by the dashed double-dotted line. When the movable chuck member 412 is located at the chuck position and the shield plate 123 is in close proximity to the upper surface of the substrate 9, the base part 422 of the movable chuck member 412 and the first chucking magnetic material 441 are in very close proximity to each other. Thus, the base part 422 and the first chucking magnetic material 441 comes in contact with each other before the movable chuck member 412 moves to the unchuck position. In a state in which the movable chuck member 412 tilts to the position at which it comes in contact with the first chucking magnetic material 441, the substrate 9 cannot get out of the recessed part 425.

In other words, a change in the position of the movable chuck member 412 from the chuck position toward the unchuck position results in the movable chuck member 412 coming in contact with the first chucking magnetic material 441 of the shield plate 123 before the hold on the substrate 9 is released. This mechanically prevents a situation that the hold on the substrate 9 is released during processing. Note that such a mechanism for preventing the hold on the substrate 9 from being released may be achieved in such a manner that the movable chuck member 412 comes in contact with other portions of the shield plate 123 when moved in a state in which the shield plate 123 is located in the down position.

When the first chucking magnetic material 441 moves downward, magnetic action causes the movable chuck member 412 to move to the chuck position before the first chucking magnetic material 441 (or other portions of the shield plate 123) comes in contact with the base part 422. Alternatively, a configuration is also possible in which the first chucking magnetic material 441 or other parts slidably come in contact with the base part 422 to push the movable chuck member 412.

As illustrated in FIG. 7, the movable chuck member 412 includes the pendent part 424. The provision of the pendent part 424 brings the center of gravity of the movable chuck member 412 down below the turning axis 401. Thus, if a centrifugal force acts on the movable chuck member 412 due to high-speed rotation of the substrate holding part 14, a force that enables rotation in the clockwise direction in FIG. 7 acts on the movable chuck member 412. That is, a force that turns the movable chuck member 412 in a direction to hold the substrate 9 acts on the movable chuck member 412. Consequently, the substrate 9 can be stably held during rotation.

Figure 13:
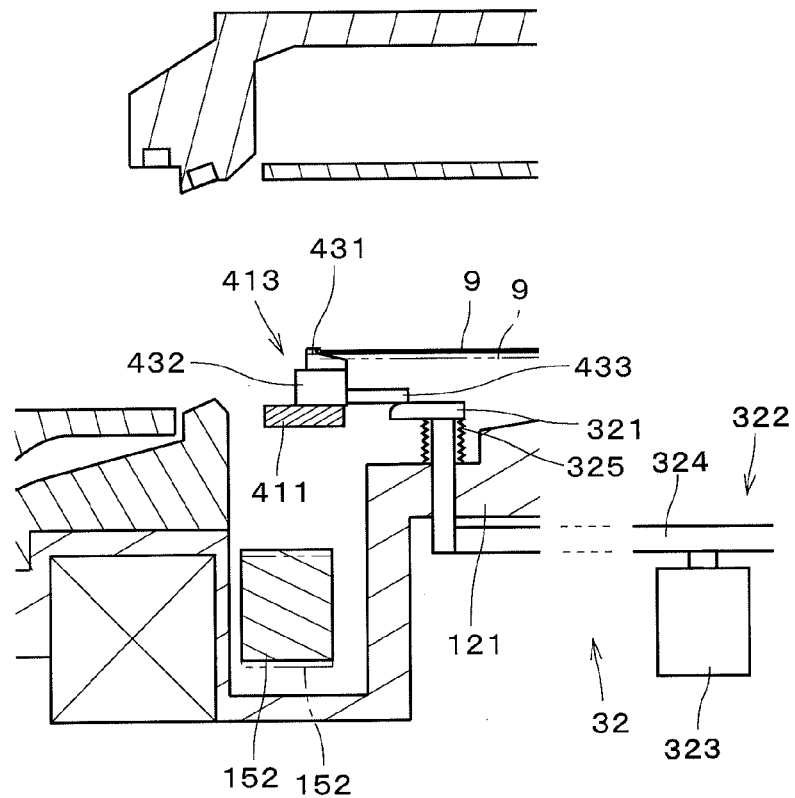
FIG. 13 is a longitudinal cross-sectional view of a fixed chuck member and a second pushing-up mechanism.

FIG. 13 is a longitudinal cross-sectional view of one fixed chuck member 413 and the second pushing-up mechanism 32. The fixed chuck member 413 is fixed to the chuck support part 411 and includes a hook part 431, a base part 432, and a lever part 433. The hook part 431 is the same as that of the movable chuck member 412. The base part 432 is fixed on the chuck support part 411. The hook part 431 is fixed on the base part 432. The lever part 433 extends radially inward from the base part 432.

Figure 19:
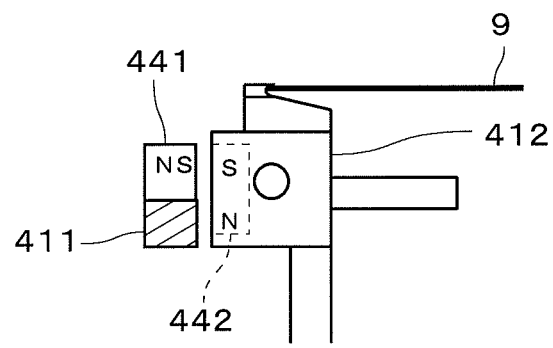
FIG. 19 illustrates yet another example of the mechanism for chucking a substrate.

As illustrated in FIGS. 13 and 19, the second pushing-up mechanism 32 has the same structure as the first pushing-up mechanism 31, but generates a smaller pushing stroke than the first pushing-up mechanism 31. The second pushing-up mechanism 32 includes a second contact part 321 and a second contact-part movement mechanism 322. The second contact-part movement mechanism 322 includes a cylinder 323 with a guide, and an arm 324. The second contact part 321 is attached to the upper end of the arm 324. To separate the inside and outside of the chamber body 121, the arm 324 is covered with a bellows 325 between the second contact part 321 and the bottom of the chamber body 121.

When the cylinder 323 moves the second contact part 321 upward in parallel with the central axis J1 along with the arm 324, the second contact part 321 comes in contact with the lever part 433 of the fixed chuck member 413. The second contact part 321 may be moved in a direction that is not parallel to the central axis J1 as long as the direction is along the central axis J1. When the second contact part 321 is further moved upward and pushes the lever part 433, the fixed chuck member 413 is moved upward because the rotor 152 of the substrate rotation mechanism 15 is in a floating state. In FIG. 13, the substrate 9 and the rotor 152 before being moved upward are indicated by dashed double-dotted lines.

The amount of upward movement of the fixed chuck member 413 is equal to the amount by which the movable chuck member 412 is pushed and moved upward by the first pushing-up mechanism 31. That is, the movable chuck member 412 that is pushed by the first pushing-up mechanism 31 tilts and moves upward. In FIG. 11, the substrate 9 and the rotor 152 before being moved upward are indicated by dashed double-dotted lines. At this time, the second pushing-up mechanism 32 pushes up the fixed chuck member 413 by the same distance to prevent the substrate 9 from tilting. This allows the substrate 9 to be maintained in a horizontal position, improving reliability in transferring the substrate 9 between an external conveyance device and the substrate holding part 14.

In the case of unchucking, the central axis of the substrate holding part 14 (hereinafter, referred to as a "holding-part central axis") does not necessarily have to coincide with the central axis J1 of the substrate processing apparatus 1, i.e., the central axis of the substrate rotation mechanism 15. It is sufficient for the second contact-part movement mechanism 322 of the second pushing-up mechanism 32 to have a function of maintaining the holding-part central axis in parallel with the central axis J1.

Figure 14:
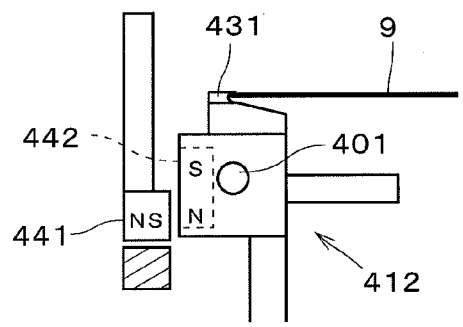
FIG. 14 illustrates another example of the first and second chucking magnetic materials.

FIG. 14 illustrates another example of the first chucking magnetic material 441 and the second chucking magnetic material 442. In the example in FIG. 14, when the shield plate 123 approaches the upper surface of the substrate 9, the first chucking magnetic material 441 approaches a portion of the second chucking magnetic material 442 below the level of the turning axis 401. Then, a force that holds the substrate 9 is exerted on the movable chuck member 412 by the attractive force between the first and second chucking magnetic materials. That is, a force that rotates the movable chuck member 412 and moves the hook part 431 radially inward acts on the movable chuck member 412. In the case of using such an attractive force, one of the first chucking magnetic material 441 and the second chucking magnetic material 442 may be a magnetic material other than a magnet, such as iron.

Figure 15:
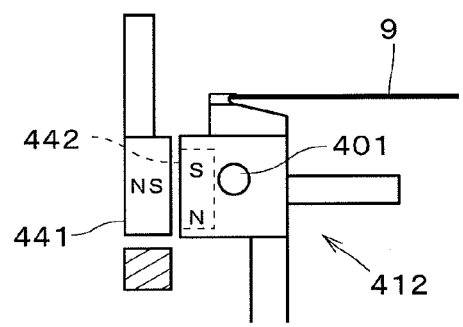
FIG. 15 illustrates yet another example of the first and second chucking magnetic materials.

FIG. 15 illustrates yet another example of the first chucking magnetic material 441 and the second chucking magnetic material 442. In the example in FIG. 15, when the shield plate 123 approaches the upper surface of the substrate 9, the upper portion of the first chucking magnetic material 441 approaches a portion of the second chucking magnetic material 442 above the level of the turning axis 401, and the lower portion of the first chucking magnetic material 441 approaches a portion of the second chucking magnetic material 442 below the level of the turning axis 401. Then, a repulsive force is generated between the upper portion of the first chucking magnetic material 441 and the upper portion of the second chucking magnetic material 442, and an attractive force is generated between the lower portion of the first chucking magnetic material 441 and the lower portion of the second chucking magnetic material 442. Accordingly, a strong force that holds the substrate 9 acts on the movable chuck member 41.

Figure 16:
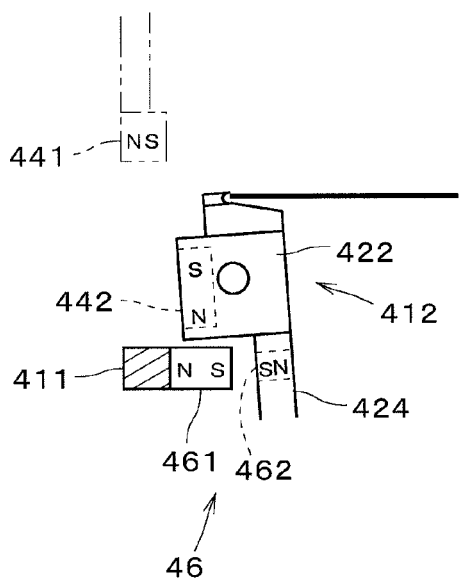
FIG. 16 illustrates another example of the unchucking part.

FIG. 16 illustrates another example of the unchucking part. An unchucking part 46 in FIG. 16 is provided as part of the substrate holding part 14. The movable chuck member 412 has no lever part 423. The unchucking part 46 includes a first unchucking magnetic material 461 that is provided on the chuck support part 411, and a second unchucking magnetic material 462 that is provided in the movable chuck member 412. The second unchucking magnetic material 462 is provided in the pendent part 424, and as magnetic action, a repulsive force acts between the first unchucking magnetic material 461 and the second unchucking magnetic material 462. Accordingly, a torque in the couterclockwise direction in FIG. 16 acts on the movable chuck member 412, and the movable chuck member 412 is held in the unchuck position.

In actuality, a stopper is provided to stop the circular movement of the movable chuck member 412 at the unchuck position.

The operations performed in the case of chucking are the same as those in the case of FIG. 8, but because the movable chuck member 412 is maintained in the unchuck position before the shield plate 123 is moved down, the first chucking magnetic material 441 and the movable chuck member 412 are spaced from each other with a sufficient margin in the radial direction to avoid the occurrence of interference between the first chucking magnetic material 441 and the base part 422 of the movable chuck member 412 when the shield plate 123 is moved downward. When the first chucking magnetic material 441 is moved downward, the repulsive force between the first chucking magnetic material 441 and the second chucking magnetic material 442 becomes superior to the repulsive force between the first unchucking magnetic material 461 and the second unchucking magnetic material 462, causing the movable chuck member 412 to be turned and maintained at the chuck position.

Alternatively, unchucking may be achieved by using the attractive force, which is the magnetic action arising between the first unchucking magnetic material 461 and the second unchucking magnetic material 462. Both of the first unchucking magnetic material 461 and the second unchucking magnetic material 462 do not necessarily have to be magnets, and a structure is possible in which one of the first unchucking magnetic material 461 and the second unchucking magnetic material 462 is a magnet and the other is a magnetic material such as iron. The layout of the first unchucking magnetic material 461 and the second unchucking magnetic material 462 may be modified in various ways.

Figure 17:
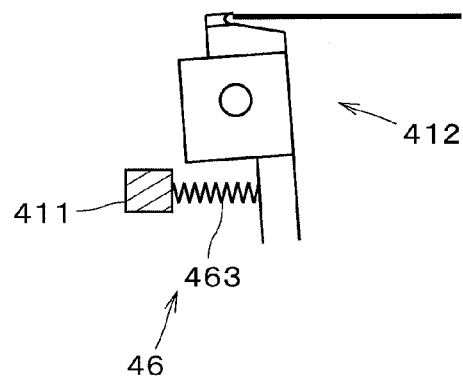
FIG. 17 illustrates yet another example of the unchucking part.

The unchucking part can be configured in various forms as long as an unchucking force that holds each movable chuck member 412 in the unchuck position acts on the movable chuck member 412 when the first chucking magnetic material 441 and the second chucking magnetic material 442 are spaced from each other. For example, instead of the first unchucking magnetic material 461 and the second unchucking magnetic material 462, a compression spring 463 may be provided between the chuck support part 411 and the movable chuck member 412 as illustrated in FIG. 17. In this case, the unchucking part 46 uses the restoring force of the compression spring 463 to hold the movable chuck member 412 at the unchuck position. The operations performed in the case of chucking are the same as those in the case of FIG. 16.

By using magnets or springs that generate the unchucking force, it is possible to easily provide the unchucking part 46 in the substrate holding part 14. Alternatively, other elastic materials such as rubber may be used instead of springs. As another alternative, gravity may be used for unchucking.

FIGS. 18A to 18D illustrate another example for achieving chucking of the substrate 9. The unchucking part 30 is the same as that illustrated in FIGS. 9, 11, and 13. In the substrate processing apparatus 1, a magnetic-material movement mechanism 47 is provided within the chamber body 121. The magnetic-material movement mechanism 47 mounts the first chucking magnetic material 441 on the substrate holding part 14. The movable chuck member 412 includes the second chucking magnetic material 442 as in the case of FIG. 8. When the first chucking magnetic material 441 is mounted on the substrate holding part 14, the magnetic action between the first chucking magnetic material 442 and the second chucking magnetic material 442 causes the movable chuck member 412 to move to the chuck position.

The magnetic-material movement mechanism 47 is attached to the inner peripheral surface of the chamber side-wall part 214. The magnetic-material movement mechanism 47 includes an actuator 471 and an arm 472. The arm 472 is approximately L-shaped and has a top portion that extends in the horizontal direction. The first chucking magnetic material 441 is placed at the end of the arm 472. The actuator 471 moves the arm 472 up and down and turns the arm 472. The chuck support part 411 has an upwardly extending projection 475 on the outside of the movable chuck member 412 in the radial direction, and a groove 476 that is recessed radially inward from the outer periphery of the chuck support part 411 and located on the outside of the projection 475 in the radiation direction.

Figure 18A:
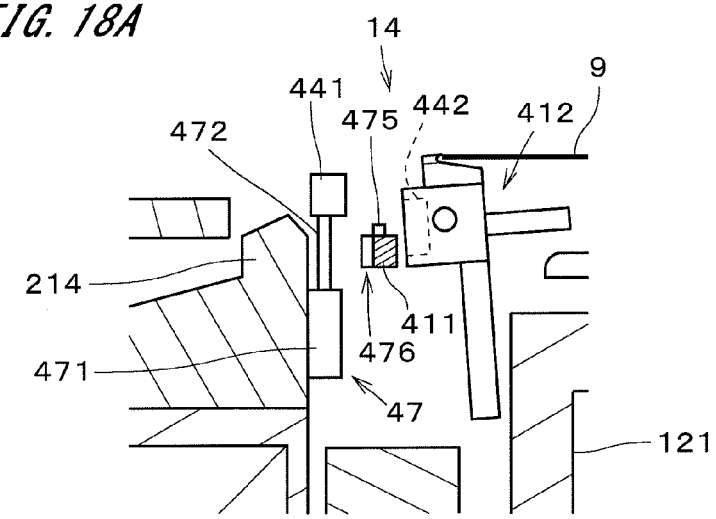
FIG. 18A illustrates another example of the mechanism for chucking a substrate.
Figure 18B:
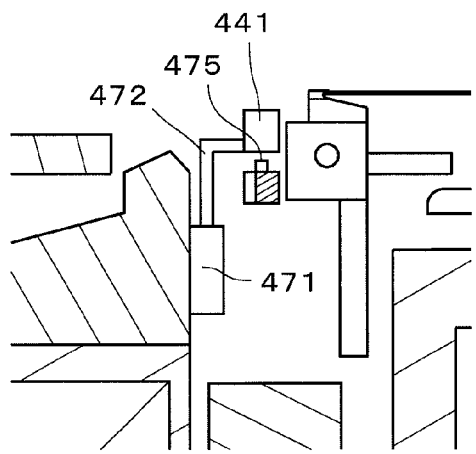
FIG. 18B illustrates another example of the mechanism for chucking a substrate.
Figure 18C:
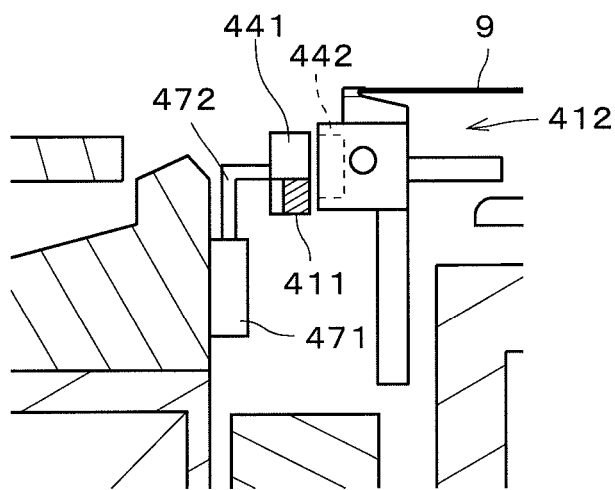
FIG. 18C illustrates another example of the mechanism for chucking a substrate.

In the case of unchucking, the first chucking magnetic material 441 is located on the arm 472, and the upper portion of the arm 472 that extends in the horizontal direction is approximately parallel to the circumferential direction centered about the central axis J1. In the case of chucking, first the actuator 471 rotates the arm 472 so that the first chucking magnetic material 441 is moved above the projection 475 as illustrated in FIG. 18B. The bottom of the first chucking magnetic material 441 has a recessed portion that is recessed upward. When the actuator 471 moves the arm 472 down, the projection 475 and the recessed portion of the first chucking magnetic material fit together as illustrated in FIG. 18C.

Figure 18D:
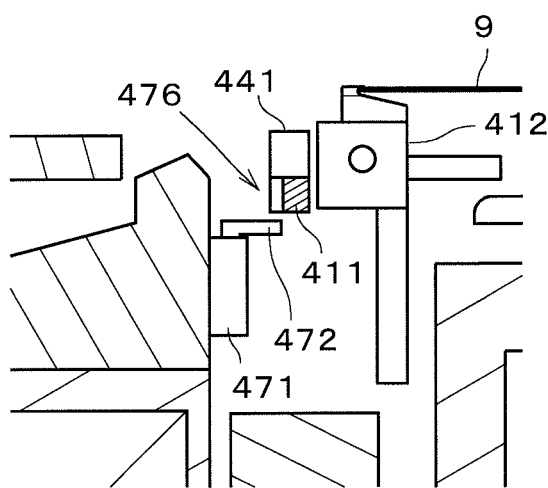
FIG. 18D illustrates another example of the mechanism for chucking a substrate.

When the first chucking magnetic material 441 is mounted on the chuck support part 411, a force that holds the outer edge portion of the substrate 9 along with the fixed chuck member 413 is exerted on the movable chuck member 412 by the magnetic action between the first chucking magnetic material 441 and the second chucking magnetic material 442. Consequently, the movable chuck member 412 is moved to the chuck position to hold the substrate 9. The actuator 471 further moves the arm 472 down, so that the first chucking magnetic material 441 becomes detached from the arm 472, and the end of the arm 472 passes through the groove 476 and moves to a position below the chuck support part 411 as illustrated in FIG. 18D.

In the case of processing the substrate 9, the first chucking magnetic material 441 rotates along with the substrate holding part 14 and the substrate 9. Thus, the hold on the substrate 9 is maintained during processing. The provision of the magnetic-material movement mechanism 47 makes it possible to hold the substrate 9 with the simple structure of the substrate holding part 14. Such a structure is in particular suitable for the case where the rotor 152 of the substrate rotation mechanism 15 is in a floating state.

In the case of unchucking, the magnetic-material movement mechanism 47 performs operations in the reverse order to chucking, i.e., the first chucking magnetic material 441 is detached from the chuck support part 411 and placed on the arm 472. Thereafter, the first pushing-up mechanism 31 and the second pushing-up mechanism 32 of the unchucking part 30 in FIG. 9 push the movable chuck members 412 and the fixed chuck members 413 upward to release the hold on the substrate 9 while the substrate 9 is maintained in a horizontal position.

The mounting position of the first chucking magnetic material 441 is not limited to the chuck support part 411, and the first chucking magnetic material 441 may be mounted at other positions of the substrate holding part 14 that are fixed relative to the chuck support part 411.

Other parts illustrated in FIG. 16 or 17 may also be used as the unchucking part in the case where the magnetic-material movement mechanism 47 is provided.

FIG. 19 illustrates yet another example for achieving hold on the substrate 9. The first chucking magnetic material 441 is fixed to the chuck support part 411 (including positions that are fixed relative to the chuck support part 411). The second chucking magnetic material 442 is provided in the movable chuck member 412 as in the case of FIG. 8. When the unchucking part 30 generates no force, a force that holds the outer edge portion of the substrate 9 along with the fixed chuck member 413 is exerted on the movable chuck member 412 by the magnetic action between the first chucking magnetic material 441 and the second chucking magnetic material 442.

Figure 20:
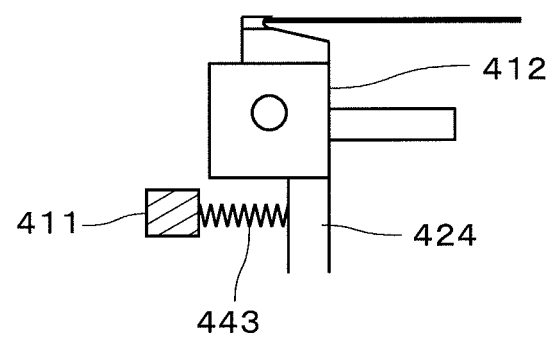
FIG. 20 illustrates yet another example of the mechanism for chucking a substrate.

A mechanism for applying a force that holds the substrate 9 on the movable chuck member 412 may be achieved by a spring 443 as illustrated in FIG. 20. In the example in FIG. 20, the spring 443 is provided between the chuck support part 411 and the pendent part 424 of the movable chuck member 412. The spring 443 has a force that brings the chuck support part 411 and the pendent part 424 close to each other. In the examples in FIGS. 19 and 20, a force required for unchucking is greater than in the other examples, but it is possible to simplify the structure necessary to hold the substrate 9. As described above, the chucking part may be achieved with various structures as long as the force that holds the outer edge portion of the substrate 9 along with the fixed chuck member 413 acts on the movable chuck member 412 when the substrate 9 is held by the substrate holding part 14. For example, other elastic members such as rubber may be used instead of the spring 443. As another alternative, gravity may be used for chucking.

Figure 21A:
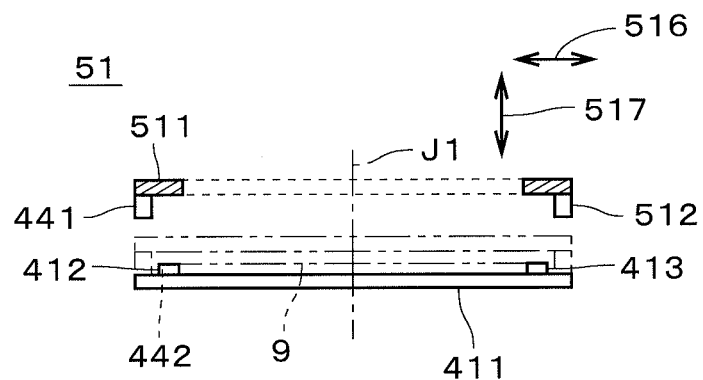
FIG. 21A illustrates yet another example of the mechanism for chucking a substrate.
Figure 21B:
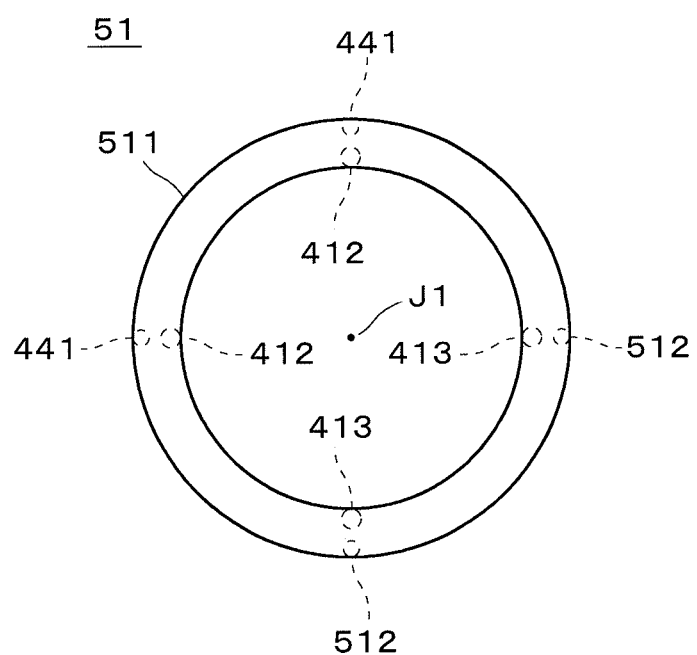
FIG. 21B illustrates yet another example of the mechanism for chucking a substrate.

FIG. 21A is a schematic cross-sectional view illustrating, in simplified form, another example of the chucking part that applies a chucking force on the movable chuck member 412. FIG. 21B is a schematic plan view of FIG. 21A. A chucking part 51 includes a ring member 511 centered about the central axis J1, instead of the shield plate 123 in FIG. 1. The lower surface of the ring member 511 has two first chucking magnetic materials 441 that project downward, and two pins 512. The ring member 511 is provided independently of the chamber lid part 122 (see FIG. 1), moved by a conveyance robot in the horizontal direction and in the up-down direction as indicated by arrows 516 and 517, and placed on the chuck support part 411. The first chucking magnetic materials 441 and the pins 512 fit with projections (not shown) of the chuck support part 411 and rotate along with the substrate holding part 14.

The principle by which the substrate 9 is held by the movable chuck members 412 and the fixed chuck members 413 is the same as in the case of FIG. 1. More specifically, the substrate 9 is held by moving the first chucking magnetic materials 441 into close proximity to the second chucking magnetic materials 442 of the movable chuck member 412 to hold the substrate 9. In the case of FIGS. 21A and 21B, the chucking part 51 is implemented by the ring member 511, the first chucking magnetic materials 441, the second chucking magnetic materials 442, and a robot that conveys the ring member 551. The conveyance robot is a magnetic-material movement mechanism for mounting the first chucking magnetic materials 441 on the substrate holding part 14 and removing the first chucking magnetic materials 441 from the substrate holding part 14. The ring member 511 may be grasped or adsorbed by the conveyance robot. Since there is no shield plate 123, processing liquids may be supplied onto the substrate 9 from scanning nozzles.

In the example in FIG. 1, the chucking part is implemented by the shield plate 123, the first chucking magnetic materials 441, the second chucking magnetic materials 442, and the chamber opening-and-closing mechanism 131. The chamber opening-and-closing mechanism 131 functions as the magnetic-material movement mechanism.

Figure 22A:
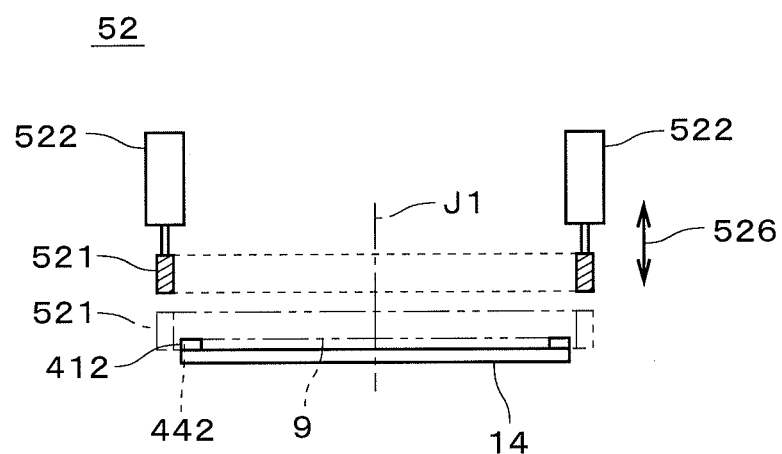
FIG. 22A illustrates yet another example of the mechanism for chucking a substrate.
Figure 22B:
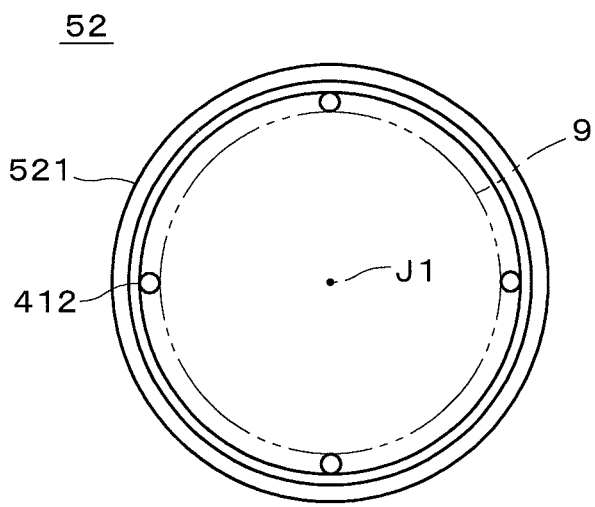
FIG. 22B illustrates yet another example of the mechanism for chucking a substrate.

FIG. 22A is a schematic cross-sectional view illustrating another example of the chucking part. FIG. 22B is a schematic plan view of FIG. 22A. A chucking part 52 includes a ring-shaped first chucking magnetic material 521 centered about the central axis J1, a magnetic-material movement mechanism 522, and a second chucking magnetic material 442 of the movable chuck member 412. The first chucking magnetic material 521 is moved up and down by the magnetic-material movement mechanism 522 as indicated by an arrow 526. The first chucking magnetic material 521 can employ various mechanisms such as a cylinder, a motor, and a ball screw. The first chucking magnetic material 521, even when moved down, does not come in contact with the substrate holding part 14. The first chucking magnetic material 521 thus does not rotate along with the substrate holding part 14.

When the first chucking magnetic material 521 is moved down, the first chucking magnetic material 521 and the second chucking magnetic material 442 come in close proximity with each other to hold the substrate 9. When the first chucking magnetic material 521 is moved up, the first chucking magnetic material 521 and the second chucking magnetic material 442 are moved away from each other, and the force that holds the substrate 9 disappears.

Since the first chucking magnetic material 521 is ring-shaped, the magnetic action between the first chucking magnetic material 521 and the second chucking magnetic material 442 is maintained even during rotation of the substrate holding part 14. Consequently, the hold on the substrate 9 is maintained. In this way, the magnetic-material movement mechanism 522 may be a mechanism for moving the first chucking magnetic material 521 into close proximity to the substrate holding part 14 and moving the first chucking magnetic material 521 away from the substrate holding part 14. This chucking part 52 can also hold the substrate 9 with a simple structure. In particular, it is also possible to hold the substrate 9 when the substrate rotation mechanism 15 is a floating motor.

As in the case of FIG. 21A, the first chucking magnetic material 521 may be conveyed by a conveyance robot to a position in close proximity to the substrate holding part 14. In this case, the first chucking magnetic material 521 may be placed on the substrate holding part 14 and rotated along with the substrate holding part 14.

Figure 23A:
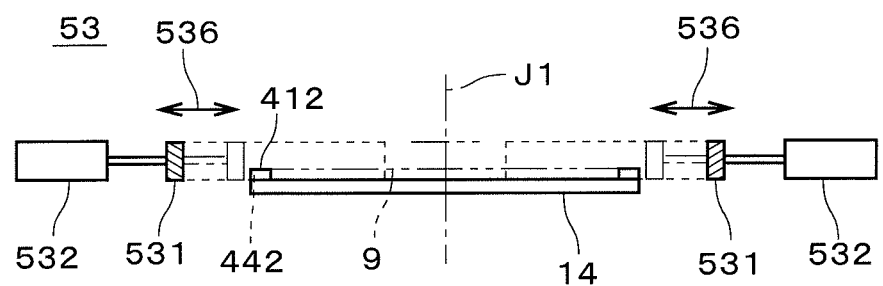
FIG. 23A illustrates yet another example of the mechanism for chucking a substrate.
Figure 23B:
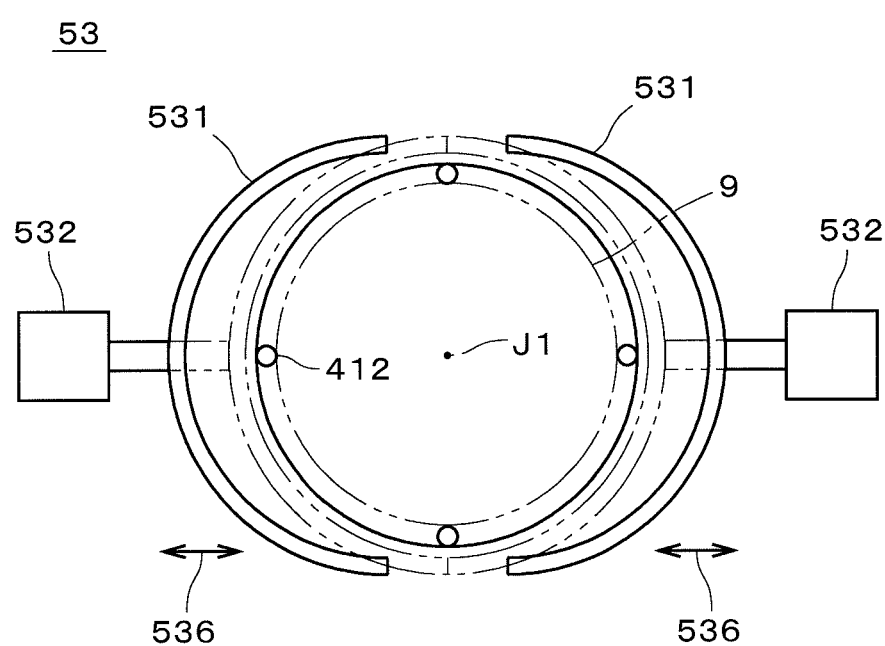
FIG. 23B illustrates yet another example of the mechanism for chucking a substrate.

FIG. 23A is a schematic cross-sectional view illustrating yet another example of the chucking part. FIG. 23B is a schematic plan view of FIG. 23A. As compared with the chucking part in FIGS. 22A and 22B, a chucking part 53 includes two half-round arcuate members as first chucking magnetic materials 531, and a magnetic-material movement mechanism 532 that moves the two first chucking magnetic materials 531 right and left as indicated by arrows 536. The other constituent elements are the same as those in FIGS. 22A and 22B.

The two first chucking magnetic materials 531, having approached each other, form a ring-shaped magnetic material centered about the central axis J1 as in FIG. 22B. The first chucking magnetic materials 531 are not in contact with the substrate holding part 4. The magnetic action between the first chucking magnetic materials 531 and the second chucking magnetic material 442 is maintained even during rotation of the substrate holding part 14. Consequently, the hold on the substrate 9 by the movable chuck member 412 is maintained. In this way, the magnetic-material movement mechanism 532 moves the first chucking magnetic materials 531 into close proximity to the substrate holding part 14 and moves the first chucking magnetic materials 531 away from the substrate holding part 14.

In either case of FIGS. 21A, 22A, and 23A, at least one of the first chucking magnetic material and the second chucking magnetic material is a magnet.

Next, another example of the unchucking part 30 will be described. Constituent elements other than the unchucking part 30 are the same as those in the above-described embodiments and given the same reference numerals.

Figure 24:
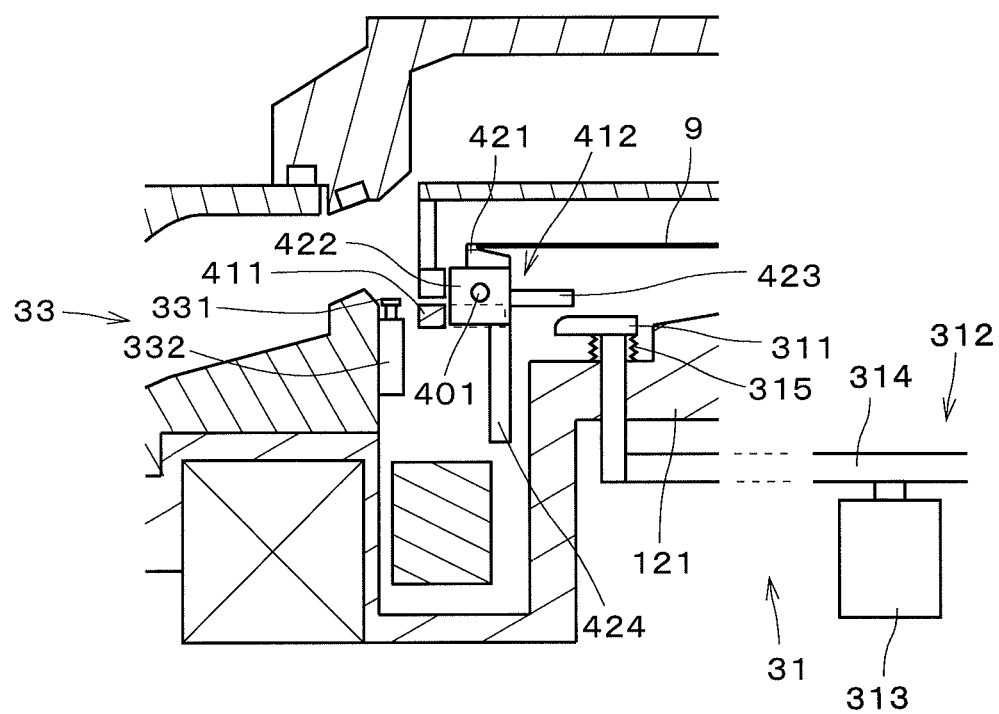
FIG. 24 is a cross-sectional view of the substrate processing apparatus.
Figure 25:
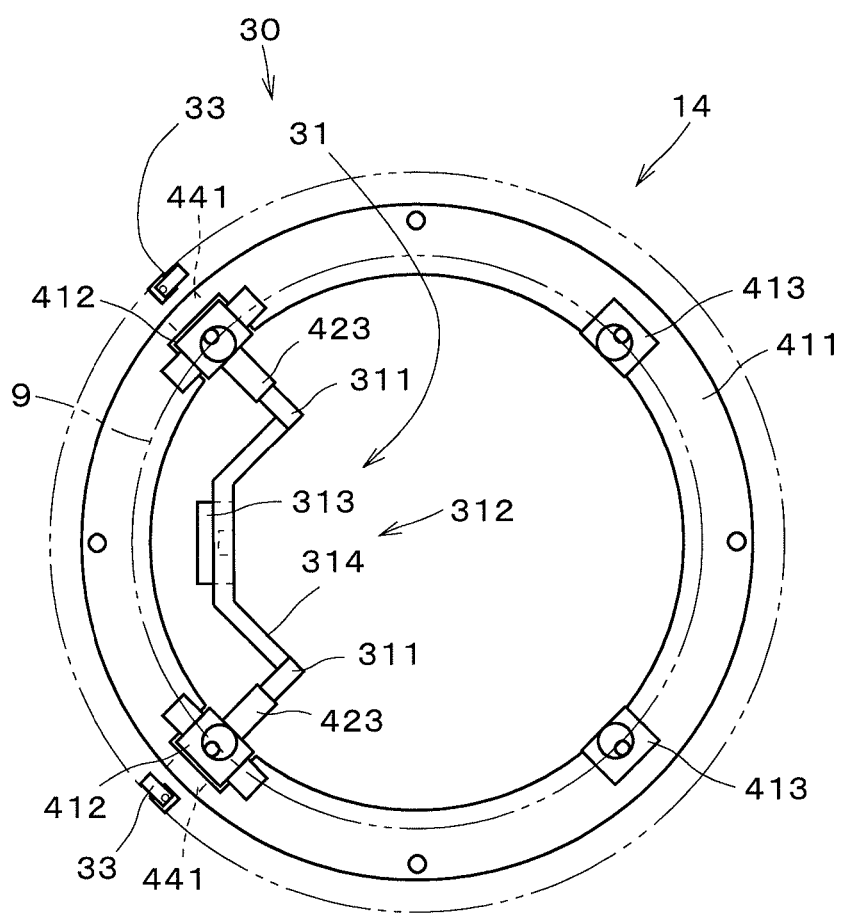
FIG. 25 is a plan view of the substrate holding part and the unchucking part.

FIG. 24 is a longitudinal cross-sectional view of the substrate processing apparatus 1 in the vicinity of a movable chuck member 412, illustrating a state in which the substrate 9 is held. FIG. 25 is a plan view of the substrate holding part 14 and the unchucking part 30. Two movable chuck members 412 and two fixed chuck members 413 are provided on the chuck support part 411. The four chuck members are disposed at equal intervals in the circumferential direction. In FIG. 25, the position at which the first chucking magnetic material 441 is disposed is indicated by broken lines. The unchucking part 30 includes a pushing-up mechanism 31 and two anti-tilt parts 33. FIG. 24 illustrates part of the pushing-up mechanism 31 and one anti-tilt part 33.

Figure 26A:
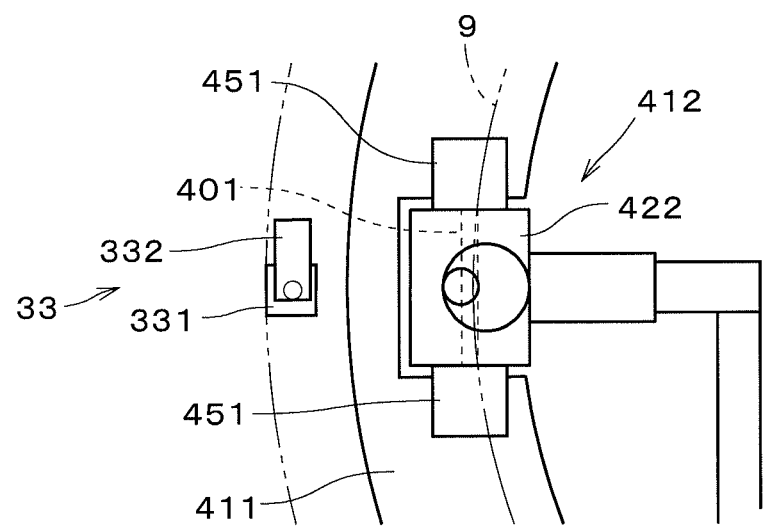
FIG. 26A is an enlarged plan view of a movable chuck member and the periphery thereof.

FIG. 26A is an enlarged plan view of one movable chuck member 412 and the vicinity thereof. The annular, plate-like chuck support part 411 has an area that is recessed radially outward from the inner periphery. The movable chuck member 412 is disposed in this recessed area. On both sides of the movable chuck member 412 in the circumferential direction, support parts 451 that project upward from the body of the chuck support part 411 are provided. A turning axis 401 is fixed between the two support parts 451. The turning axis 401 passes through the base part 422 of the movable chuck member 412. This allows the movable chuck member 412 to be turnably supported by the chuck support part 411.

Each fixed chuck member 413 includes a base part and a hook part. The base part is fixed on the chuck support part 411. The hook part has the same shape as the hook part 421 of the movable chuck member 412.

As illustrated in FIGS. 24 and 25, the pushing-up mechanism 31 includes an contact part 311 and a contact-part movement mechanism 312. The contact-part movement mechanism 312 includes a cylinder 313 with a guide, and an arm 314. The contact part 311 is attached to the upper end of the arm 314. To separate the inside and outside of the chamber body 121, the arm 314 is covered with a bellows 315 between the contact part 311 and the bottom of the chamber body 121.

Figure 26B:
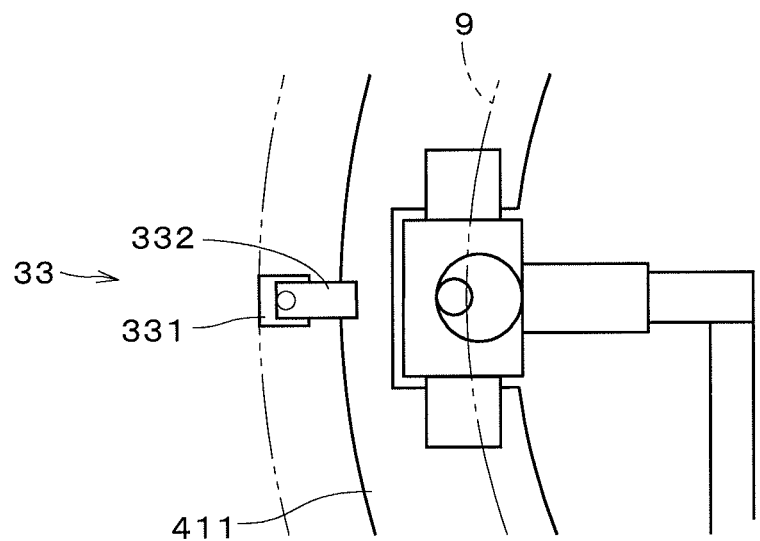
FIG. 26B is an enlarged plan view of a movable chuck member and the periphery thereof.

The anti-tilt part 33 includes a motor 331 and an anti-tilt member 332 as illustrated in FIGS. 24 and 26A. The anti-tilt member 332 is horizontally attached to the upper end of a shaft of the motor 331. FIG. 26A illustrates a state in which the anti-tilt member 332 faces in the circumferential direction centered about the central axis J1, and FIG. 26B illustrates a state in which the anti-tilt member 332 faces in the radial direction centered about the central axis J1. The anti-tilt member 332 can rotate, but the position of the anti-tilt member 332 relative to the stator 151 can be fixed at each position (the position only needs to be fixed and does not necessarily have to be locked). The chuck support part 411 and the anti-tilt member 332 do not overlap in the plan view of FIG. 26A, whereas the anti-tilt member 332 partly overlaps with the chuck support part 411 in FIG. 26B. The lower surface of the anti-tilt member 332 is located slightly above the upper surface of the chuck support part 411.

During processing of the substrate 9, the anti-tilt member 332 faces in the direction in FIG. 26A.

In the case of releasing the hold on the substrate 9, first, the shield plate 123 is moved up. At this stage, the movable chuck member 412 is maintained in the position in FIG. 24. Meanwhile, the rotational position of the anti-tilt member 332 is changed by the motor 331 from the position in FIG. 26A to the position in FIG. 26B. Then, the cylinder 313 moves the contact part 311 upward in parallel with the central axis J1 along with the arm 314, and the contact part 311 comes in contact with the lever part 423 of the movable chuck member 412. The contact part 311 may be moved in a direction that is not parallel with the central axis J1 as long as the direction is along the central axis J1. When the contact part 311 is further moved upward and pushes the lever part 423, the movable chuck member 412 turns around the turning axis 401 and the hook part 421 moves radially outward as illustrated in FIG. 27.

Figure 27:
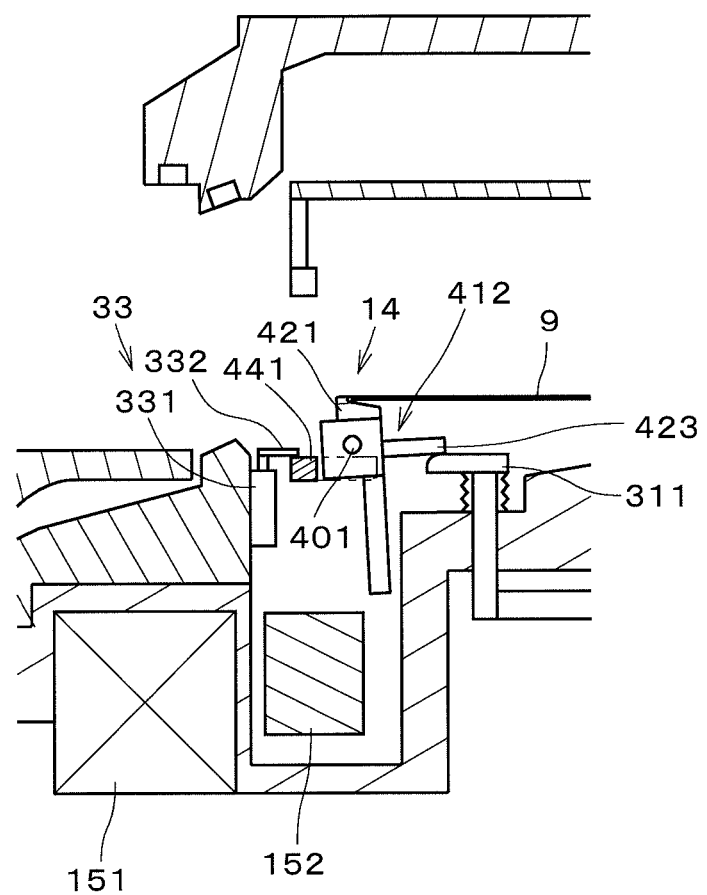
FIG. 27 is a cross-sectional view of the substrate processing apparatus.

Hereinafter, the position (to be precise, rotational position) of the movable chuck member 412 in FIG. 24 is referred to as a "chuck position." The position of the movable chuck member 412 in FIG. 27 is referred to as an "unchuck position." The position of the movable chuck member 412 is changed from the chuck position to the unchuck position by the contact part 311 of the unchucking part 30 being moved upward and pushing the lever part 423.

Since, as described previously, the rotor 152 is supported in a floating state by the stator 151, the rotor 152 and the substrate holding part 14 can be easily pushed upward. However, in the substrate processing apparatus 1 in which the anti-tilt member 332 and the chuck support part 411 overlap in the up-down direction as illustrated in FIG. 27, the anti-tilt member 332 and the chuck support part 411 come in contact with each other and prevent the substrate holding part 14 from moving upward when the contact part 311 pushes up the lever part 423. In this way, the anti-tilt part 33 of the unchucking part 30 reduces tilting of the chuck support part 411, i.e., tilting of the substrate holding part 14 and the substrate 9, during unchucking. This consequently allows the substrate 9 to be maintained in a horizontal position, improving reliability in transferring the substrate 9 between an external conveyance device and the substrate holding part 14.

In the case of holding the substrate 9, operations are performed in the reverse order. More specifically, the substrate 9 is placed on the movable chuck member 412 and the fixed chuck member 413 in a state in which the movable chuck member 412 is located at the unchuck position. The movable chuck member 412 is moved to the chuck position by downward movement of the contact part 311 and the first chucking magnetic material 441. Then, the anti-tilt member 332 is returned to the position in FIG. 26A by the motor 331. In this way, the motor 331 is a retracting mechanism for, in the case of rotating the substrate 9 along with the substrate holding part 14, retracting the anti-tilt member 332 from a rotating portion in the chamber 12. The retracting mechanism can easily prevent the anti-tilt member 332 from coming in contact with other portions that are to be rotated, while preventing tilting of the substrate 9 during unchucking.

Figure 28:
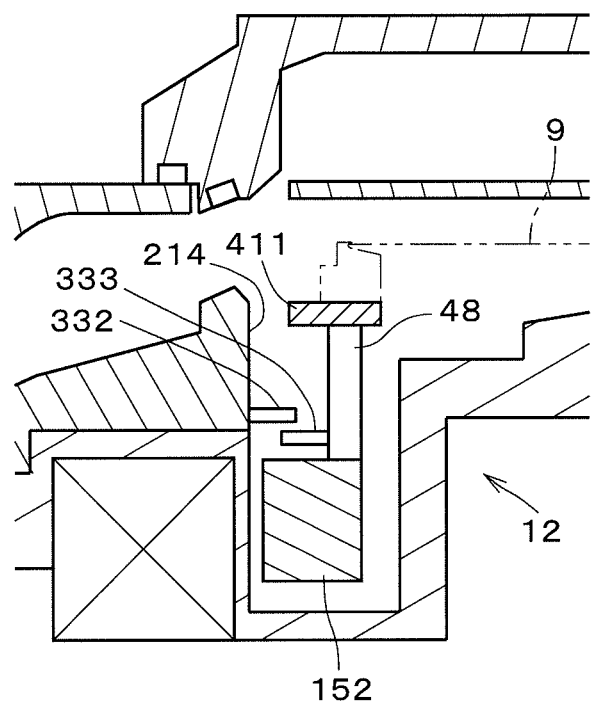
FIG. 28 illustrates another example of an anti-tilt member.

FIG. 28 illustrates another example of the anti-tilt member 332. The anti-tilt member 332 does not necessary have to be retracted from the portion that is to be rotated in the chamber 12 during processing of the substrate 9. In the example in FIG. 28, the anti-tilt member 332 is fixed to the chamber side-wall part 214 and projects radially inward from the inner peripheral surface of the chamber side-wall part 214. Meanwhile, a projecting member 333 that projects radially outward is attached to a connection member 48 that connects the rotor 152 and the chuck support part 411.

A plurality of connection members 48 are arranged in the circumferential direction and each extends in the up-down direction. The projecting member 333 is provided on a connection member 48 that is close to the movable chuck member 412. That is, the connection members 48 do not form an annular shape and are located at only the positions of the connection members 48. Preferably, two or more connection members 48 have a projecting member 333 attached thereto. The anti-tilt member 332 is located above the projecting members 333 when the substrate 9 is conveyed into and out of the chamber, and the anti-tilt member 332 and the projecting members 333 are aligned in the radial direction. The anti-tilt member 332 and the projecting members 333 are in close proximity in the up-down direction, but spaced from each other by a distance at which the anti-tilt member 332 and the projecting members 333 are reliably kept from contact with each other during rotation of the substrate 9.

As in the case of FIG. 27, when the lever part 423 of the movable chuck member 412 is pushed up by the pushing-up mechanism 31 during unchucking operations, the anti-tilt member 332 and the projecting member 333 come in contact with each other, which reduces tilting of the substrate holding part 14 and the substrate 9. Accordingly, the substrate 9 can be maintained in a horizontal position when the hold on the substrate 9 is released.

The chucking mechanism of the substrate processing apparatus in FIG. 14 can be modified in various ways as described in the above embodiments.

The substrate processing apparatus 1 can be modified in various ways.

Preferably, at least two fixed chuck members 413 are provided, and the number of fixed chuck members 413 may be one. In this case, a fixed chuck member 413 with an arcuate guide or a plurality of hooks, for example, may be provided in order to stably hold the substrate 9. Preferably, at least one movable chuck member 412 may be provided. The positions of the fixed chuck member(s) 413 and the movable chuck member(s) 412 may be determined appropriately within a range in which the substrate 9 can be supported. Preferably, the sum of the number of fixed chuck members 413 and the number of movable chuck members 412 is three or more.

In actuality, all of the chuck members may be movable chuck members 412 because the positions of the movable chuck members 412 when holding a substrate can be determined at fixed positions. In other words, the number of chuck members supported on the chuck support part 411 is at least three, and at least one of the chuck members is a movable chuck member 412.

The turning axis 401 of each movable chuck member 412 may be parallel to the central axis J1. In this case, for example, the (first) contact part 311 is moved upward to come in contact with the movable chuck member 412, and a force received from the (first) contact part 311 is converted into a force that turns the movable chuck member 412 in the horizontal direction.

The chuck position and the unchuck position of the movable chuck member 412 may be positions along linear movement, instead of rotational positions. In either case, the movable chuck member 412 is supported on the chuck support part 411 in such a condition that the position of the movable chuck member 412 can be changed between the chuck position and the unchuck position.

The first contact part 311 and the second contact part 321 of the unchucking part 30 may be moved downward for unchucking, for example, as long as they move in the same direction. In this case, the substrate 9 and the substrate holding part 14 are moved downward for unchucking while being maintained in horizontal positions.

The second pushing-up mechanism 32 may come in contact with the chuck support part 411 and push the chuck support part 411. In this case, the second contact part 321 of the second pushing-up mechanism 32 is preferably in contact with a portion in the vicinity of the fixed chuck member 413 of the chuck support part 411. By causing the second contact part 321 to come in contact with the fixed chuck member 413 or a portion in the vicinity of the fixed chuck member 413, the position and orientation of the substrate holding part 14 can be stably maintained.

Unchucking may be achieved by moving the contact part 311 of the unchucking part 30 in FIG. 24 downward. In this case, a rotatable portion such as the substrate holding part 14 comes in contact with the upper portion of the anti-tilt member 332 at the time of unchucking.

The layout of the anti-tilt member 332 and the structure of the anti-tilt part 33 may be modified in various ways. The anti-tilt member 332 may be provided in various forms as long as the position of the anti-tilt member 332 relative to the stator 151 is fixed. For example, the anti-tilt member 332 may project radially outward from the inner side-wall part 212. Alternatively, the anti-tilt member 332 may be attached to a portion that is specially provided within the chamber 12.

The anti-tilt member 332 may also be provided in various forms as a portion whose position relative to the stator 151 can be fixed. For example, the retracting mechanism may retract the anti-tilt member 332 linearly from a rotating portion such as the substrate holding part 14 or the rotor 152. Alternatively, the anti-tilt member 332 may be moved up or down and thereby retracted from a rotating portion. As another alternative, two small pieces may be provided as the anti-tilt member 382 and used to pinching a part of a rotating portion to reduce tilting of the substrate holding part 14 and the substrate 9.

A portion that comes in contact with the anti-tilt member 332 at the time of unchucking may be changed in various ways as long as this portion is the chuck support part 411 or a portion whose position relative to the chuck support part 411 is fixed. For example, the anti-tilt part 332 may come in contact with the rotor 152.

The number of anti-tilt members 332 may be one. Similarly, the number of projecting members 333 in FIG. 28 may be one. Preferably, the number of anti-tilt members 332 is two or more. In this case, these anti-tilt members 332 are disposed at different positions in the circumferential direction. If the chuck support part 411 or a portion whose position relative to the chuck support part 411 is fixed, i.e., a rotating portion comes in contact with the two or more anti-tilt members 332, it is possible to reliably prevent tilting of the substrate holding part 14 and the substrate 9.

A structure may be employed in which the anti-tilt member 332 is long in the circumferential direction, and the anti-tilt member 332 and a rotating portion come in contact with each other at a plurality of different positions in the circumferential direction. This case is substantially equivalent to the case where the number of anti-tilt members 332 is two or more. The position in the circumferential direction at which the portion that is to be rotated and the anti-tilt member 332 comes in contact is preferably close to the position of the movable chuck member 412 in the circumferential direction. The anti-tilt member 332 may be arranged in various ways within a range in which tilting of the substrate holding part 14 in the case of unchucking can reliably be prevented.

The substrate processing apparatus 1 may include a pressure application part for supplying a gas to the chamber space 120 and applying pressure. The chamber space 120 is pressurized in the second sealed state in which the chamber 12 is sealed, and placed in a pressurized atmosphere higher than atmospheric pressure. Note that the heated-gas supply part 187 may additionally serve as the pressure application part.

The chamber opening-and-closing mechanism 131 does not necessarily have to move the chamber lid part 122 in the up-down direction, and may move the chamber body 121 to which the chamber lid part 122 is fixed, in the up-down direction. The chamber 12 is not limited to have an approximately cylindrical shape, and may be of various shapes.

The shapes and structures of the stator 151 and the rotor 152 of the substrate rotation mechanism 15 may be modified in various ways. The rotor 152 does not necessarily have to rotate in a floating state, and a structure is possible in which a structure such as a guide that mechanically supports the rotor 152 is provided within the chamber 12, and the rotor 152 is rotated along this guide. The substrate rotation mechanism 15 does not necessarily have to be a hollow motor, and an axial-rotation motor may be used as the substrate rotation mechanism.

The substrate processing apparatus 1 may perform cleaning of the substrate 9 in the enlarged sealed space 100 in the first sealed state. The enlarged sealed space 100 may be formed by brining a different portion (e.g., side wall part 611) other than the upper surface part 612 of the cup part 161 into contact with the chamber lid part 122. The shape of the cup part 161 may be changed appropriately. The cleaning of the substrate 9 does not necessarily have to be performed in a sealed space, and may be performed in an open space.

In the substrate processing apparatus 1, the chemical solution supplied from the chemical-solution supply part 183 may be used in various processes other than the aforementioned etching process, such as removal of an oxide film on the substrate or a polymer adhering to the substrate, or development using a developer.

The substrate processing apparatus 1 may be used to process substrates other than semiconductor substrates, such as glass substrates used in display devices including liquid crystal displays, plasma displays, and field emission displays (FEDs). The substrate processing apparatus 1 may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2014-064488 filed in the Japan Patent Office on Mar. 26, 2014, Japanese Patent Application No. 2014-064491 filed in the Japan Patent Office on Mar. 26, 2014, Japanese Patent Application No. 2014-064489 filed in the Japan Patent Office on Mar. 26, 2014, and Japanese Patent Application No. 2014-064490 filed in the Japan Patent Office on Mar. 26, 2014, the entire disclosures of which are incorporated herein by reference.

REFERENCE SIGNS LIST

1 Substrate processing apparatus
9 Substrate
14 Substrate holding part
15 Substrate rotation mechanism
30, 46 Unchucking part
47, 522, 532, 632 Magnetic-material movement mechanism
123 Shield plate
131 Chamber opening-and-closing mechanism (shield-plate elevating mechanism)
151 Stator
152 Rotor
311 (First) Contact part
312 (First) Contact-part movement mechanism
321 Second contact part
322 Second contact-part movement mechanism
331 Motor (retracting mechanism)
332 Anti-tilt member
333 Projecting member
411 Chuck support part
412 Movable chuck member
413 Fixed chuck member
441, 521, 531 First chucking magnetic material
442 Second chucking magnetic material
461 First unchucking magnetic material
462 Second unchucking magnetic material
J1 Central axis

The invention claimed is:

1. A substrate processing apparatus for processing a substrate, comprising:
    a substrate holding part for holding a substrate;
    a substrate rotation mechanism for rotating said substrate holding part about a central axis perpendicular to said substrate; and
    a magnetic-material movement mechanism for mounting a first chucking magnetic material on said substrate holding part and removing said first chucking magnetic material from said substrate holding part,
    wherein said substrate holding part includes:
    a chuck support part; and
    at least three chuck members supported on said chuck support part,
    said at least three chuck members includes at least one movable chuck member whose position can be changed between a chuck position and an unchuck position, and
    each movable chuck member included in said at least one movable chuck member includes a second chucking magnetic material that applies a force that holds an outer edge portion of said substrate on said each movable chuck member by magnetic action between said first chucking magnetic material and said second chucking magnetic material when said first chucking magnetic material is mounted on said substrate holding part.

2. The substrate processing apparatus according to claim 1, further comprising:
    a shield plate that faces an upper surface of said substrate, wherein said shield plate includes said first chucking magnetic material, and
    said magnetic-material movement mechanism is a shield-plate elevating mechanism for moving said shield plate up and down.

3. The substrate processing apparatus according to claim 1, wherein
said substrate rotation mechanism includes:
a rotor that has an annular shape centered about said central axis and includes a permanent magnet; and
a stator that has an annular shape centered about said central axis and rotates said rotor that is in a floating state.

4. The substrate processing apparatus according to claim 1, wherein
said substrate holding part includes an unchucking part for applying an unchucking force that holds said at least one movable chuck member at said unchuck position on said at least one movable chuck member when said first chucking magnetic material and said second chucking magnetic material are away from each other.

5. The substrate processing apparatus according to claim 4, wherein
said unchucking part includes first and second unchucking magnetic materials, and
said unchucking force is magnetic action produced between said first and second unchucking magnetic materials.

6. The substrate processing apparatus according to claim 1, wherein
each movable chuck member included in said at least one movable chuck member is turnable about a turning axis, and
a force that turns said each movable chuck member in a direction for holding said substrate is exerted on said each movable chuck member by a centrifugal force produced by rotation of said substrate holding part.

7. The substrate processing apparatus according to claim 1, wherein
when the position of said at least one movable chuck member is changed from said chuck position to said unchuck position while said first chucking magnetic material is mounted on or in close proximity to said substrate holding part, said at least one movable chuck member comes in contact with said first chucking magnetic material before the hold on said substrate is released.

8. A substrate processing apparatus for processing a substrate, comprising:
a substrate holding part for holding a substrate;
a substrate rotation mechanism for rotating said substrate holding part about a central axis perpendicular to said substrate; and
an unchucking part for releasing the hold on said substrate by said substrate holding part,
wherein said substrate rotation mechanism includes:
a rotor that has an annular shape centered about said central axis and includes a permanent magnet; and
a stator that has an annular shape centered about said central axis and rotates said rotor that is in a floating state,
said substrate holding part includes:
a chuck support part; and
at least three chuck members that are supported on said chuck support part,
said at least three chuck members includes:
at least one fixed chuck member that is fixed to said chuck support part; and
at least one movable chuck member whose position can be changed between a chuck position and an unchuck position,
a force that holds an outer edge portion of said substrate acts on said at least one movable chuck member when said substrate is held by said substrate holding part, and
said unchucking part includes:
a contact part;
a contact-part movement mechanism for moving said contact part in a direction along said central axis such that said contact part contacts with and pushes said at least one movable chuck member to change the position of said at least one movable chuck member from said chuck position to said unchuck position; and
an anti-tilt part for preventing tilting of said chuck support part while said contact part is in contact with said at least one movable chuck member.

9. The substrate processing apparatus according to claim 8, wherein
said unchucking part includes, as said anti-tilt part:
another contact part; and
a second contact-part movement mechanism for moving said another contact part in a direction along said central axis and pushing said another contact part into contact with said chuck support part or said at least one fixed chuck member to maintain a holding-part central axis in parallel with said central axis of said substrate rotation mechanism, said holding-part central axis being a central axis of said substrate holding part.

10. The substrate processing apparatus according to claim 9, wherein
said another contact part pushes said at least one fixed chuck member or a portion of said chuck support part in the vicinity of said at least one fixed chuck member.

11. The substrate processing apparatus according to claim 8, wherein
said unchucking part includes, as said anti-tilt part:
an anti-tilt member whose position relative to said stator is fixed or can be fixed and that prevents tilting of said chuck support part by coming in contact with said chuck support part or a portion whose position relative to said chuck support part is fixed, while said contact part is in contact with said at least one movable chuck member.

12. The substrate processing apparatus according to claim 11, wherein
said unchucking part further includes a retracting mechanism for retracting said anti-tilt member from a rotating portion when said substrate is rotated along with said substrate holding part.

13. The substrate processing apparatus according to claim 11, wherein
said unchucking part further includes another anti-tilt member that is disposed at a different position from said anti-tilt member in a circumferential direction, and
said anti-tilt member and said another anti-tilt member are in contact with said chuck support part or said portion whose position relative to said chuck support part is fixed.

14. The substrate processing apparatus according to 8, further comprising:
a shield plate that faces an upper surface of said substrate; and
a shield-plate elevating mechanism for moving said shield plate up and down,
wherein said shield plate includes a first chucking magnetic material, and
each movable chuck member included in said at least one movable chuck member includes a second chucking magnetic material that applies said force that holds the outer edge portion of said substrate on said each movable chuck member by magnetic action between said first chucking magnetic material and said second chucking magnetic material when said shield plate is moved into close proximity to said upper surface of said substrate.

15. The substrate processing apparatus according to claim 8, further comprising:
a magnetic-material movement mechanism for mounting a first chucking magnetic material on said substrate holding part and removing said first chucking magnetic material from said substrate holding part, or for moving a first chucking magnetic material into close proximity to said substrate holding part and moving said first chucking magnetic material away from said substrate holding part,
wherein each movable chuck member included in said at least one movable chuck member includes a second chucking magnetic material that applies said force that holds the outer edge portion of said substrate on said each movable chuck member by magnetic action between said first chucking magnetic material and said second chucking magnetic material when said first chucking magnetic material is mounted on said substrate holding part or moved into close proximity to said substrate holding part.

16. The substrate processing apparatus according to claim 8, wherein
said substrate holding part further includes:
a first chucking magnetic material that is fixed to said chuck support part; and
a second chucking magnetic material that applies said force that holds the outer edge portion of said substrate on said at least one movable chuck member by magnetic action between said first chucking magnetic material and said second chucking magnetic material.

17. A substrate processing apparatus for processing a substrate, comprising:
a substrate holding part for holding a substrate;
a substrate rotation mechanism for rotating said substrate holding part about a central axis perpendicular to said substrate;
a magnetic-material movement mechanism for mounting a first chucking magnetic material on said substrate holding part and removing said first chucking magnetic material from said substrate holding part, or for moving a first chucking magnetic material into close proximity to said substrate holding part and moving said first chucking magnetic material away from said substrate holding part; and
a shield plate that faces an upper surface of said substrate, wherein said substrate holding part includes:
a chuck support part; and
at least three chuck members supported on said chuck support part,
said at least three chuck members includes at least one movable chuck member whose position can be changed between a chuck position and an unchuck position,
each movable chuck member included in said at least one movable chuck member includes a second chucking magnetic material that applies a force that holds an outer edge portion of said substrate on said each movable chuck member by magnetic action between said first chucking magnetic material and said second chucking magnetic material when said first chucking magnetic material is mounted on said substrate holding part or moved into close proximity to said substrate holding part,
said shield plate includes said first chucking magnetic material, and
said magnetic-material movement mechanism is a shield-plate elevating mechanism for moving said shield plate up and down.

18. The substrate processing apparatus according to claim 17, wherein
said substrate rotation mechanism includes:
a rotor that has an annular shape centered about said central axis and includes a permanent magnet; and
a stator that has an annular shape centered about said central axis and rotates said rotor that is in a floating state.

19. The substrate processing apparatus according to claim 17, wherein
said substrate holding part includes an unchucking part for applying an unchucking force that holds said at least one movable chuck member at said unchuck position on said at least one movable chuck member when said first chucking magnetic material and said second chucking magnetic material are away from each other.

20. The substrate processing apparatus according to claim 17, wherein
each movable chuck member included in said at least one movable chuck member is turnable about a turning axis, and
a force that turns said each movable chuck member in a direction for holding said substrate is exerted on said each movable chuck member by a centrifugal force produced by rotation of said substrate holding part.

21. The substrate processing apparatus according to claim 17, wherein
when the position of said at least one movable chuck member is changed from said chuck position to said unchuck position while said first chucking magnetic material is mounted on or in close proximity to said substrate holding part, said at least one movable chuck member comes in contact with said first chucking magnetic material before the hold on said substrate is released.

\* \* \* \* \*